US006272586B1

(12) United States Patent
Roohparvar et al.

(10) Patent No.: US 6,272,586 B1
(45) Date of Patent: *Aug. 7, 2001

(54) MEMORY SYSTEM HAVING PROGRAMMABLE CONTROL PARAMETERS

(75) Inventors: Frankie F. Roohparvar; Darrell D. Rinerson, both of Cupertino; Christophe J. Chevallier, Palo Alto; Michael S. Briner, San Jose, all of CA (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/103,844

(22) Filed: Jun. 24, 1998

Related U.S. Application Data

(63) Continuation of application No. 08/508,828, filed on Jul. 28, 1995, now Pat. No. 5,801,985.

(51) Int. Cl.[7] .............................. G06F 12/00; G11C 8/00
(52) U.S. Cl. .............. 711/103; 365/185.01; 365/185.02; 365/185.24; 365/189.01
(58) Field of Search ...................... 711/103; 365/185.01, 365/189.01, 185.24, 185.02, 185.33, 189.09

(56) References Cited

U.S. PATENT DOCUMENTS

| | | | |
|---|---|---|---|
| 4,309,627 | * 1/1982 | Tabata | 327/81 |
| 4,460,982 | 7/1984 | Gee et al. | 365/185.19 |
| 4,571,704 | 2/1986 | Bohac, Jr. | 365/185.07 |
| 4,858,185 | 8/1989 | Kowshik et al. | 365/185.07 |
| 5,031,142 | 7/1991 | Castro | 365/49 |
| 5,047,664 | * 9/1991 | Moyal | 327/566 |
| 5,144,159 | * 9/1992 | Frisch et al. | 327/198 |
| 5,214,316 | * 5/1993 | Nagai | 327/143 |
| 5,249,158 | * 9/1993 | Kynett et al. | 365/185.11 |
| 5,262,990 | * 11/1993 | Mills et al. | 365/189.02 |
| 5,280,447 | * 1/1994 | Hazen et al. | 365/185.11 |
| 5,311,470 | 5/1994 | Atsumi et al. | 365/189.07 |
| 5,369,754 | * 11/1994 | Fandrich et al. | 711/103 |

(List continued on next page.)

FOREIGN PATENT DOCUMENTS

| | | |
|---|---|---|
| 63048698 | 3/1988 | (JP) . |
| 3-206709 | * 9/1991 | (JP) . |
| 6131879 | 5/1994 | (JP) . |

Primary Examiner—Reginald G. Bragdon
(74) Attorney, Agent, or Firm—Schwegman, Lundberg, Woessner & Kluth P.A.

(57) ABSTRACT

A memory system capable of being configured for optimum performance after fabrication using control parameters stored in non-volatile data storage units. The system includes an array of memory cells, separate from the data storage units, arranged in a multiplicity of rows and a multiplicity of columns, with each cell located in one of the rows being coupled to a common word line and with each cell located in one of the columns being coupled to a common bit line. Control circuitry for controlling memory operations such as programming the memory cells and reading the memory cells when the memory system is in a normal mode of operation. The non-volatile data storage units store control parameter data used by the control means for controlling the memory operations, with the control parameters being modifiable when the memory system is placed in an alternative mode of operation as opposed the normal mode of operation. Once the memory has been fabricated and characterized, the control parameters can be selected for optimum memory performance and loaded into the data storage units.

31 Claims, 19 Drawing Sheets

U.S. PATENT DOCUMENTS

| | | | |
|---|---|---|---|
| 5,377,199 | * | 12/1994 | Fandrich ............................ 371/22.31 |
| 5,378,936 | * | 1/1995 | Kokubo et al. ........................ 327/77 |
| 5,402,370 | | 3/1995 | Fazio et al. ..................... 365/185.26 |
| 5,463,757 | * | 10/1995 | Fandrich et al. ..................... 711/103 |
| 5,485,595 | * | 1/1996 | Assar et al. .......................... 711/103 |
| 5,509,134 | * | 4/1996 | Fandrich et al. ..................... 711/103 |
| 5,526,364 | | 6/1996 | Roohparvar ........................ 371/22.1 |
| 5,546,561 | * | 8/1996 | Kynett et al. ........................ 711/163 |
| 5,615,159 | | 3/1997 | Roohparvar ..................... 365/185.07 |
| 5,619,453 | | 4/1997 | Roohparvar et al. ........... 365/185.33 |
| 5,627,784 | | 5/1997 | Roohparvar ..................... 365/189.01 |
| 5,661,690 | | 8/1997 | Roohparvar .......................... 365/201 |
| 5,675,540 | | 10/1997 | Roohparvar ..................... 365/185.22 |
| 5,677,885 | | 10/1997 | Roohparvar .......................... 365/201 |

* cited by examiner

MEMORY SYSTEM HAVING PROGRAMMABLE CONTROL PARAMETERS

This application is a continuation of U.S. Ser. No. 08/508,828 filed Jul. 28, 1995 which issued as U.S. Pat. No. 5,801,985 on Sep. 1, 1998.

BACKGROUND OF THE INVENTION

1. Field of the Invention

The present invention relates generally to memory systems, and in particular to memory systems having programmable control parameters which control the operation of the memory and which can be reprogrammed after the memory system has been fabricated.

2. Background Art

Integrated circuit memory systems have been developed having very large storage capacities. Although attempts have been made to carefully control the fabrication of these memory systems so as to increase the yield, there invariably will be differences in memory system characteristics even for memory systems that utilize the same design. These differences in characteristics are attributable to many factors but the majority of differences are due to processing variations. Thus, memory systems taken from one semiconductor wafer may differ significantly from those taken from other wafers.

It is usually not possible to fully characterize a memory system until it is completely fabricated. At that point, it is not possible to modify the memory system to take into account the characteristics of the memory. By way of example, in a flash memory system it is possible to electrically program, read and erase the flash cells. The logic state of the cell is set by either programming or erasing the cell, with programming and erasing functioning to alter the threshold voltage of the cell. When the cell is read, the threshold voltage of the cell is determined in order to establish the logic state of the cell. However, the characteristics of the flash cell, such as the exact manner in which the flash cells respond to programming pulses or erase pulses, are not easily ascertained. The threshold voltage of the cell of one memory system may change one amount after a single programming pulse is applied and a cell of a another supposedly identical memory system may change a different amount after the same programming pulse is applied to it.

In order to accommodate these variations in memory system characteristics, it is typically necessary to design the system assuming worst case conditions. In that event, the overall performance of the system will almost by necessity be reduced.

Also, many processor systems which operate with an associated memory require a particular memory configuration to operate properly. By way of example, some systems require a word length of eight bits and some require sixteen bits. There are conventional memory systems available which permit the end user to control the word size to some degree. However, this somewhat increases the complexity imposed upon the end user of the memory since the end user must provide the necessary signals to the memory for controlling the word length. As a further example, most processor systems look to a certain portion of a memory for boot data at power on. Such boot data is necessary for the processor to function in system. The processor will be implemented to expect the boot data to be at a specific memory address. Some processors expect the boot data to be at the memory low addresses (bottom boot) and some processors expect the boot data to be at the memory high addresses (top boot).

In order to provide capabilities for different types of processor systems, it is possible to produce a different memory system for each application. However, it is always desirable to limit the number of different memory types which must be manufactured.

It would be desirable to have a memory system where the system can be fully characterized after fabrication and wherein certain operating parameters can then be permanently adjusted so as to provide a memory system that is optimized to take into account the particular characteristics of the system. It would also be desirable to provide the capability for modifying the configuration of a memory system after fabrication so as to reduce the number of different types of memories which must be fabricated. The present invention provides these features and other improved features as will become apparent to those skilled in the art upon a reading of the Detailed Description of the Invention together with the drawings.

SUMMARY OF THE INVENTION

A memory system capable of being configured for optimum operation after fabrication is disclosed. The system includes an array of memory cells arranged in a multiplicity of rows and a multiplicity of columns, with each cell located in one of the rows being coupled to a common word line and with each cell located in one of the columns being coupled to a common bit line. Control means is included for controlling memory operations, with the memory operations including programming the memory cells; reading the memory cells and preferably erasing the cells.

The system further includes a plurality of non-volatile data storage units, with the data storage units storing control parameter data used by the control means for controlling the memory operations. Such control parameters can include parameters for adjusting the magnitude and duration of voltage pulses applied to the memory for carrying out programming and erasing operations. They can also include parameters for controlling the length (number of bits) of the words read out and programmed into the memory. In addition, the control parameters can include parameters for controlling the addressing of the memory system so that, for example, an external address can be altered so that the actual address applied to the memory is inverted.

The memory system includes mode means for switching the memory system between a normal operating mode where the cells of the array may be programmed and read and an alternative mode where the control parameter data in the data storage units may be modified. Preferably, the alternative mode is one which is entered only by way of application of signals to the terminals of the memory system of a greater magnitude than used in normal memory operation so that accidental entry into the alterative mode is reduced. Once the memory system has been fabricated it is then possible to characterize the memory and select values for the control parameters for optimizing memory system operation, with these parameters being programmed into the non-volatile data storage units.

DETAILED DESCRIPTION OF THE INVENTION

Figure 1:
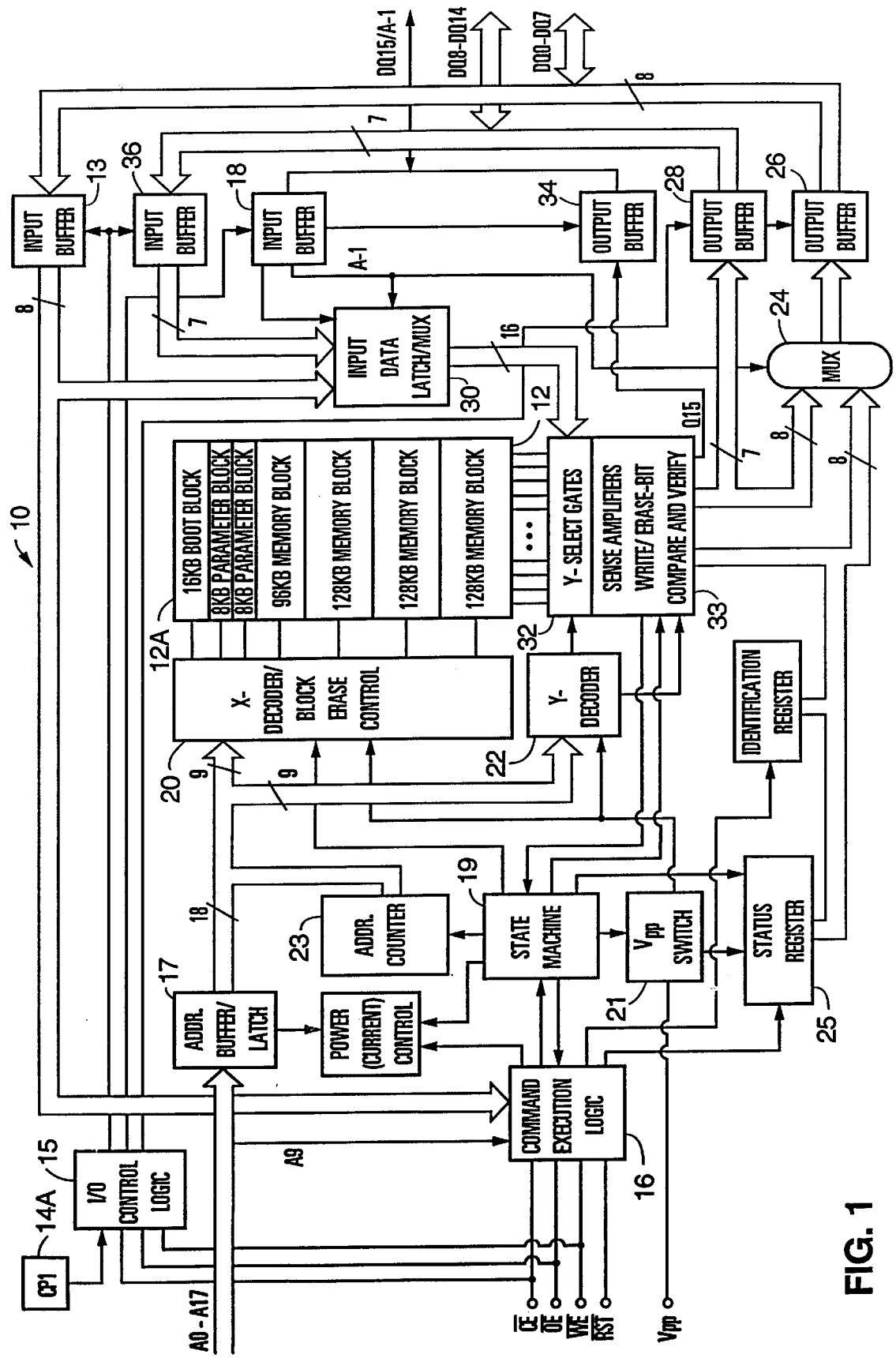
FIG. 1 is an overall block diagram of a memory system in accordance with the present invention showing certain aspects of the word length control feature.

Referring to the drawings, FIG. 1 shows a flash memory system 10 containing various aspects of the present invention. The core of the system is an Array 12 of flash memory cells arranged in rows and columns. The operation of the subject memory system can be altered by way of stored control parameters CPN which can be altered any time after the memory system has been fabricated. The different types of exemplary operations which can be controlled in this manner will now be described.

Word Length (Bus Size) Memory system 10 can be permanently configured using a stored programmable control parameters CP1 to provide either a total of 256K of eight bit words or a total of 128K of sixteen bit words. The state of the control parameter bits, including control parameter CP1, are stored in a non-volatile data storage unit 14A. The data storage unit can be of the type described in an application Ser. No. 08/508,923, now issued as U.S. Pat. No. 5,627,784 entitled "NON-VOLATILE DATA STORAGE UNIT AND METHOD OF CONTROLLING SAME", the contents of which are fully incorporated herein by reference. This application discloses a non-volatile data storage unit having flash memory cells which permit the control parameters, such as parameter CP1, to be programmed to a desired state after fabrication of the memory system has been completed. Further details regarding the construction and operation of the data storage units will be provided.

Control parameter CP1 is thus used to control the size of the subject memory system data bus, that is, the size of the data words of the memory. In the present example, the size may be either an eight bit word or a sixteen bit word. The output of storage unit 14A is connected to an I/O control logic unit 15 which controls the memory system input and output functions so as to provide either sixteen bit or eight bit word operation.

Memory operations, including programming, reading and erasing can be initiated in various ways. For all operations, the chip enable signal $\overline{CE}$ must be made active (low). In order to perform a read operation, the write enable signal $\overline{WE}$ must also be made inactive (high) For a write operation, signal $\overline{WE}$ must be made active (low). In order to reduce the likelihood of accidental modification of data, erase and program operations require receipt of two consecutive commands that are processed by a command execution logic unit 16. The program and erase commands are provided by an associated processor to data I/O terminals DQ0–DQ7 and forwarded to an input buffer 13 and then forwarded to the command execution logic unit 16 for processing.

In the event the memory has been configured to provide 256k eight bit words, a total of nineteen address bits are provided by the associated processor. Eighteen bits of address are forwarded to address terminals A0–A17 and then to an address buffer 17. The last address is provided to a A-1/DQ15 terminal. This terminal is used as the least significant address A-1 when the memory is in the eight bit word configuration and as the I/O DQ15 of the sixteen data I/O (DQ0–DQ15) when the memory is in the sixteen bit configuration.

Addresses A0–A17 are forwarded to an X decoder 20 and a Y decoder 22 to select one sixteen bit word out of array 12. In the event a read operation is being performed, the sixteen bits read out of the array 12 are forwarded to a data multiplexer 24. The I/O control logic unit 15 will direct the input buffer 18 to forward address A-1 to multiplexer 24 which will respond by selecting either the lower or higher of the eight bit words of the sixteen bits read from the memory, depending on the state of address bit A-1. The eight bits of output data are forwarded to an output buffer 26 which, in turn, couples the output data to memory terminals DQ0–DQ7. In this mode (eight bit mode), the outputs of data output buffer 28, which are connected to terminals DQ8–DQ14, are set to a high impedance state.

If a memory program operation is to be performed when the memory system is in the eight bit mode, the associated processor will provide the eighteen most significant bits of address to terminals A0–A17 and the least significant bit to terminal DQ15/A-1. The eight bits of data to be programmed at that address are forwarded by the processor to terminals DQ0–DQ7 and then to data input buffer 13. The eight bits of data are then fed to an input data latch/multiplexer 30 which selects the eight bits of data from input buffer 13 to be written to either the upper or lower half of the sixteen bits provided to the Y select gate unit 32 based upon address A-1.

The eighteen bits of address A0–A17 are used by X decoder 20 and Y decoder 22 to select a sixteen bit word in array 12. Latch/multiplexer 30 will further function to force the deselected eight bits of its output to a disabled state so these bits will not be programmed. Thus, either the upper or lower half of the sixteen bit word addressed by decoders 20 and 22 will be programmed with the eight bits of data provided by latch/multiplexer 30. The deselected half will not be programmed.

In the event control parameter CP1 is set so as to provide a sixteen bit word, the associated processor need provide only eighteen bits of address. These address bits will be applied to terminals A0–A17. If a read operation is to be performed, the eighteen bits of address are used by X decoder 20 and Y decoder 22 to select a sixteen bit word in array 12. Eight bits of the word are forwarded to multiplexer 24 which will forward these bits to output buffer 26 then to terminals DQ0–DQ7. An additional seven bits of the data read from the array 12 will be forwarded to output buffer 28 and then to terminals DQ8–DQ 14. The sixteenth data bit DQ15 of the word is forwarded to an output buffer 34 and then to dual function terminal DQ15/A-1.

In the event a memory program operation is to be performed when the system is in the sixteen bit mode, the eighteen address bits provided by the associated processor to terminals A0–A17 will select a sixteen bit word of array 12 to be programmed. The associated processor will forward the sixteen bits to be programmed to terminals DQ0–DQ7, DQ8–DQ14 and DQ15/A-1. Fifteen of the data bits will be received by input buffers 13 and 36. The sixteenth bit will be received by input buffer 18. The outputs of buffers 13, 36 and 18 are fed to latch/multiplexer 30 and then forwarded to the Y select gates unit 32 to be programmed into the word selected by the eighteen address bits.

Figure 2:
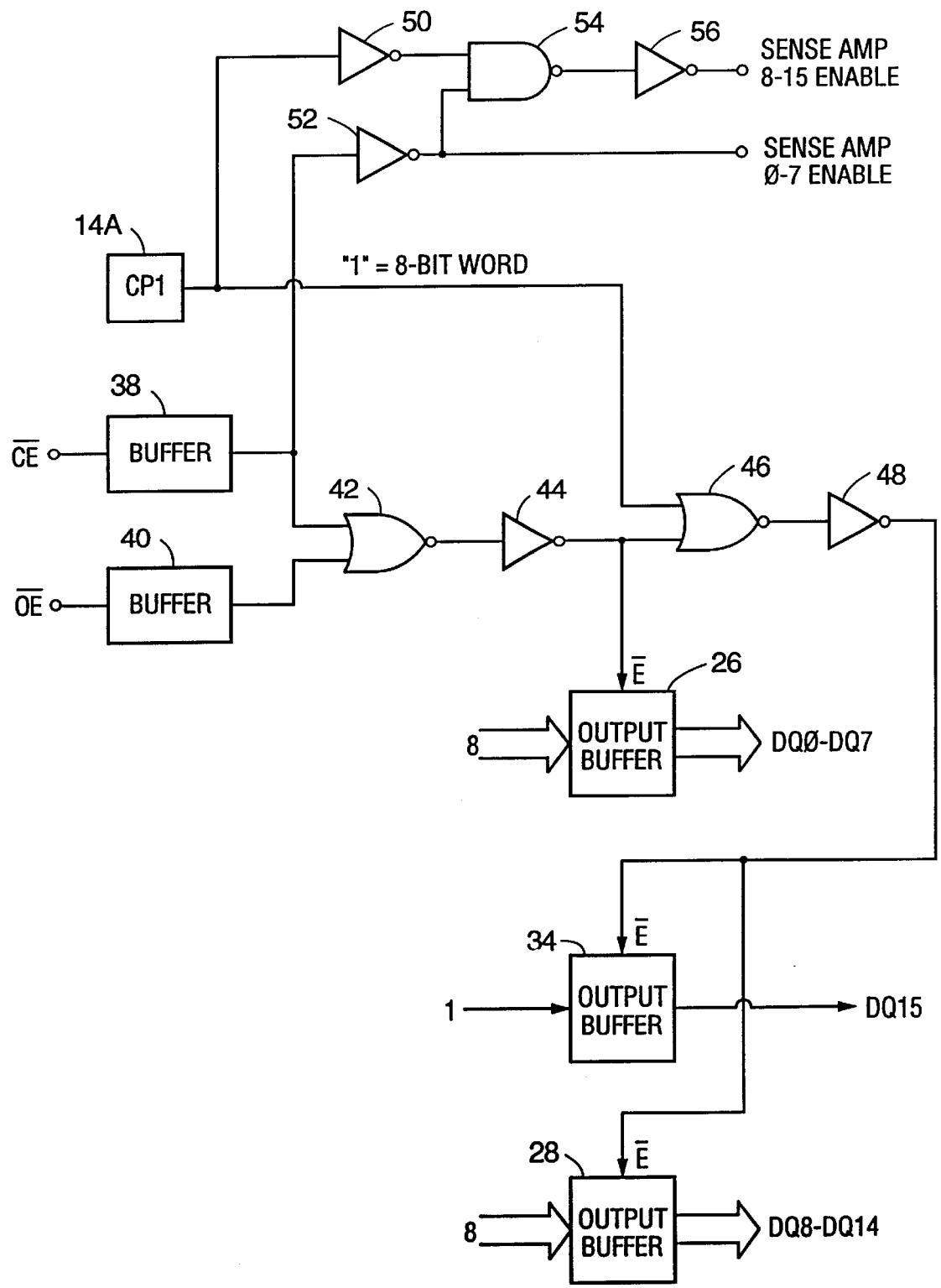
FIG. 2 is a schematic diagram of part of the subject memory system showing circuitry relating to the control of the word length based upon a stored control parameter.

FIG. 2 shows additional details regarding the word size control feature of the present invention during read operations. The data storage unit 14A stores the control parameter CP1 for controlling the word size. A CP1 value of "1" indicates a word size of eight bits and a value of "0" indicates a word size of sixteen bits. As previously noted, for any memory system operation, signal $\overline{CE}$ is made active (low) and for memory read operations, signal $\overline{OE}$ is made active (low). Signals $\overline{CE}$ and $\overline{OE}$ are both buffered by circuits 38 and 40, respectively, and the outputs are fed to the inputs of an NOR gate 42. The output of gate 42 is inverted by an inverter 44, with the output of inverter 44 functioning as an enable signal for data output buffer 26. Thus, when signals $\overline{CE}$ and $\overline{OE}$ are both active, the low signal out of inverter 44 will cause the output buffer 26 outputs DQ0–DQ7 to be active. When either signal $\overline{CE}$ or $\overline{OE}$ is inactive, the output of buffer 26 will go to an inactive or high impedance state.

The output of inverter 44 is also connected to one input of a NOR gate 46, with a second input connected to the data storage unit 14A output representing the value of control parameter CP1. The output of gate 46 is inverted by an inverter 48 which is coupled to the enable input of output buffer 34 and output buffer 28. Thus, when a read operation is being performed and when CP1 is a "1" indicating an eight bit word length, both buffers 28 and 34 will be disabled so that the outputs will be at a high impedance. Thus, the eight bits of data will be provided by buffer 26, as previously described. When CP1 is a "0", thereby indicating a sixteen bit word, all three buffers 26, 28 and 34 will be enabled so that all sixteen bits can be outputted.

Memory system 10 utilizes a total of sixteen sense amplifiers, represented by block 33 of FIG. 1, for memory read operations. These amplifiers are also used in program verification and in erase verification as will be explained later. As can be seen by the diagram of FIG. 2, when signal $\overline{CE}$ is active (low), eight of the sense amplifiers, those associated with DQ0–DQ7, are made active as indicated by the "1" output of inverter 52. The output of storage unit 14A is fed to an inverter 50, and the inverter output is fed to one input of a NAND gate 54, with the output of inverter 52 being fed to the other input of gate 54. The output of gate 54 is inverted by an inverter 56. Accordingly, when CP1 is set to a "1" indicating eight bit operation, the output of inverter 56 will be a "0" thereby causing the sense amplifiers associated with DQ8–DQ15 to be disabled. When CP1 is a "0" indicating sixteen bit operation, all of the sixteen sense amplifiers will be enabled.

Top/Bottom Addressing

As can be seen in the FIG. 1 system diagram, memory array 12 is divided into several memory blocks. The system is implemented so the memory can be erased in blocks rather than a bulk erasure where the entire memory is erased. Array 12 includes what is commonly referred to as a boot block 12A. This block is intended to contain the kernel code used to initialize a system at power on. Typically, the boot block 12A is hardware protected so that it cannot be erased unless special steps are taken.

At power on, the associated processor typically is automatically directed to read the data stored in the boot block 12A so that the system can be initialized. Some processors will attempt to start reading of the boot block data at address 3 FFFF(H) (A0–A17 are all "1") and some processors will attempt to start reading the boot block data at address 00000 (H) (A0–A17 are all "0"). These two approaches are sometimes called top and bottom addressing, respectively.

Figure 3:
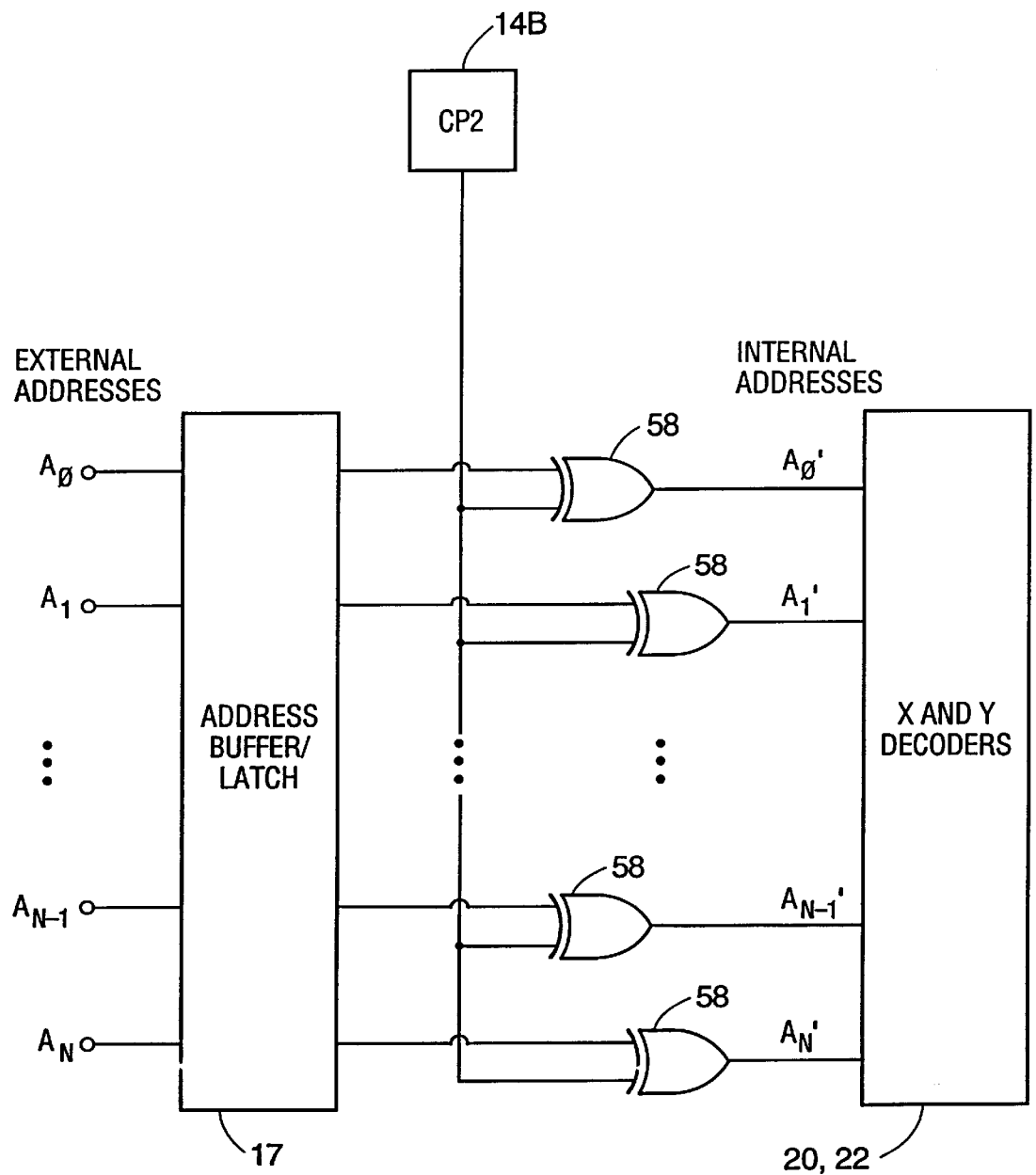
FIG. 3 is a schematic diagram of part of the subject memory system showing circuitry relating to the control of the addressing polarity based upon a stored control parameter.

The present invention includes apparatus whereby the memory system can be configured after fabrication to perform either top or bottom addressing. This eliminates the necessity of fabricating both types of memory systems. FIG. 3 is a more detailed diagram of the FIG. 1 memory system showing the manner in which the system may be configured to provide both top and bottom addressing after fabrication. A single control parameter CP2 is used for controlling the addressing type.

Parameter CP2 is stored in programmable data storage unit 14B which is similar to storage unit 14A used for storing parameter CP1. If CP2 is a "0", the external addresses A0–AN are left unchanged. Thus, if the processor initially looks for the boot block data to begin at address 00000 (H) and that is the internal address of the boot block, no changes are made to the external addresses. Thus, the internal addresses applied to the X and Y decoders 20, 22 are the same as the external addresses. In that event, control parameter CP2 is set to a "0". CP2 would also be a "0" if the processor initially looks at address 3FFFF (H) and that is, if fact, the internal address of the boot block.

If the processor initially looks at address 3FFFF(H) for the boot block data and the actual boot block is located beginning at 00000 (H), then parameter CP2 is made to be a "1". The same would be true if the initial processor address is 00000(H) and the actual starting address is 3FFFF(H).

Referring to FIG. 3, the external addresses A0–AN are each forwarded to address buffer/latch 17 and then to one input of a separate XOR (exclusive OR) gate 58. The remaining input of each of the XOR gates 58 are connected to the data storage unit 14B where parameter CP2 is stored. If CP2 has been programmed to a "0", the XOR gates will simply forward the external addresses to the X and Y decoders 20, 22. Thus, the internal and external addresses are the same. If CP2 has been programmed to a "1", the XOR gates 58 will invert the external addresses in order to create the internal addresses applied to the X and Y decoders 20, 22.

Sense Amplifier Reference Voltage

The sense amplifiers represented by block 33 of FIG. 1 are used in various memory functions, as previously noted. They are used in memory read operations so that the programmed state of the cells in array 12 can be ascertained. They are also used to verify proper programming of the cells and to verify proper erasure of the cells. In all of these operations, a voltage is developed which is indicative of current flow through the cell being sensed. That sensing voltage is compared to a reference voltage by the sense amplifier. Typically, there will be one reference voltage used in read operations and in program verify operations and another reference voltage used in erase verification operations.

In order to more fully appreciate the subject invention, a further description of the operation of the FIG. 1 memory system may be helpful. Memory system 10 is of the type which contains an internal state machine 19 to control the detailed operations of the system, such as the various individual steps necessary for carrying out programming, reading and erasing operations. The state machine 19 thus functions to reduce the overhead required of the processor (not depicted) typically used in association with the memory system 10.

By way of example, if the memory cell array 12 is to be erased (either in bulk or by block), the associated processor will cause the output enable $\overline{OE}$ pin to be inactive (high), and the chip enable $\overline{CE}$ and write enable $\overline{WE}$ terminals to be active (low). The processor can then issue an 8 bit command 20H (0010 0000) on the data I/O terminals DQ0–DQ7, typically called an Erase Setup command. This is followed by the issuance of a second eight bit command D0H (1101 0000), typically called an Erase Confirm command. Two separate commands are used so as to minimize the possibility of an inadvertent erase operation.

The commands are transferred to data input buffer 13 and then transferred to the command execution logic unit 16. The logic unit 16 then instructs the state machine 19 to perform all of the numerous and well known steps for erasing the array 12. Once the erase sequence is completed, the state machine 19 updates an 8 bit status register 25, the contents of which are transferred to data output buffer 26 which is connected to the data I/O terminals DQ0–DQ 7 of the memory system. The processor will periodically poll the data I/O terminals to read the contents of the status register 25 in order to determine whether the erase sequence has been completed and whether it has been completed successfully.

Figure 4A:
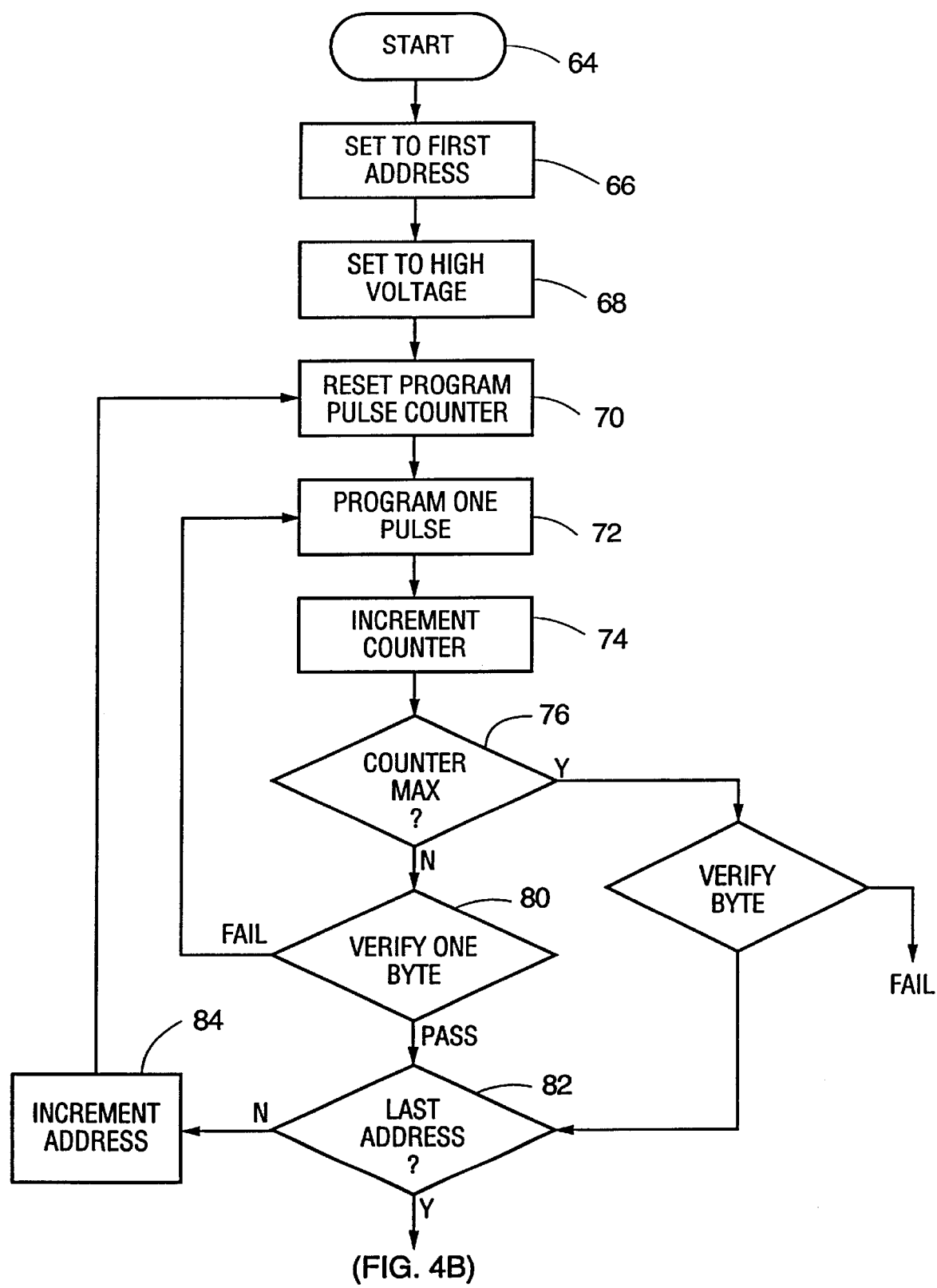
FIGS. 4A and 4B are a flow chart showing operation of the memory system state machine.
Figure 4B:
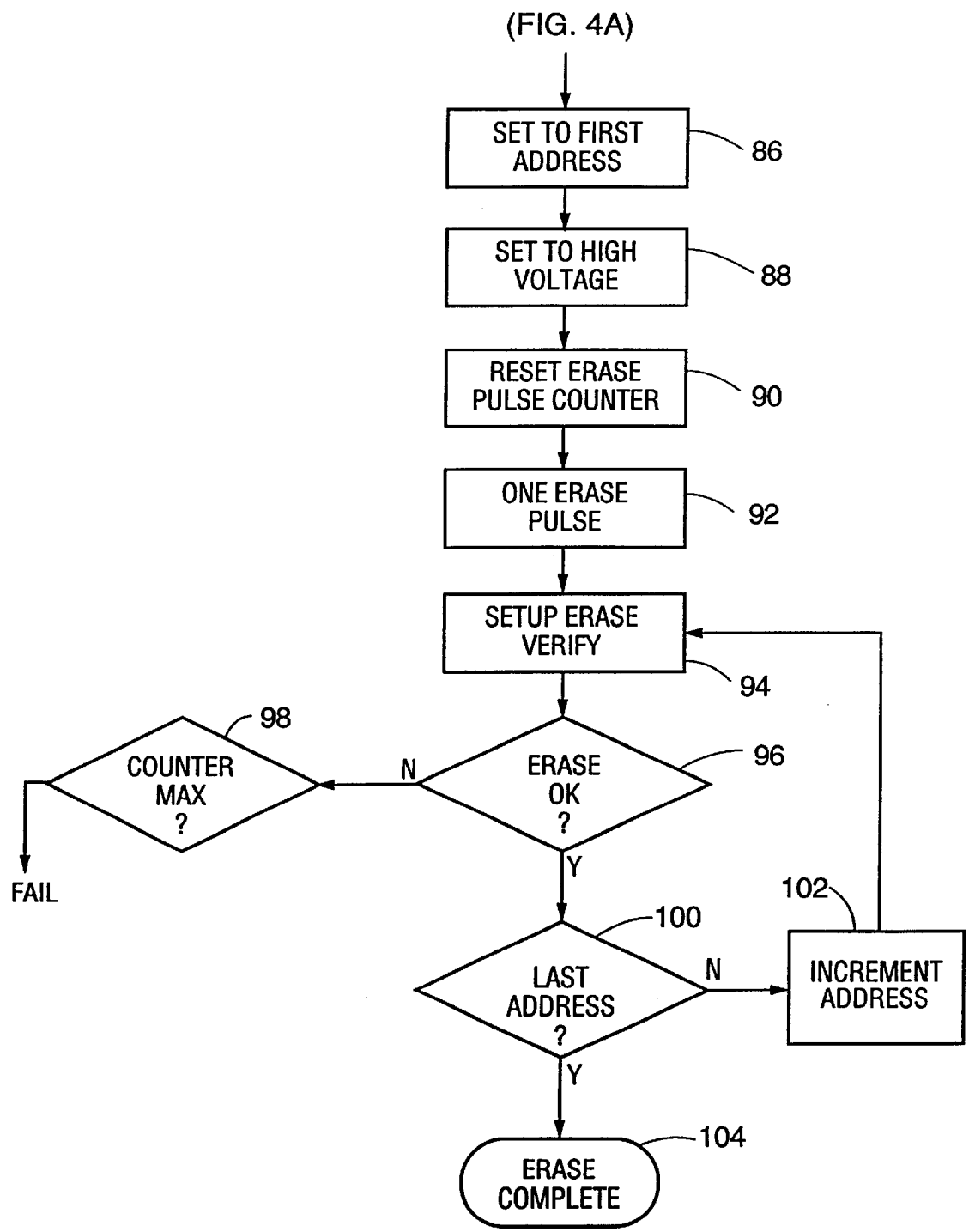

FIGS. 4A and 4B are a flow chart showing a typical erase sequence as it is carried out by state machine 19. First it should be pointed out that during any erase operation, there is a possibility that one or more cells of array 12 will become what is termed "overerased". The objective of the erase sequence is to erase all the cells of the memory array 12 so that the threshold voltages are all within a specified voltage range. That range is typically a small positive voltage range such as +1.5 to +3.0 volts. If the erased cells fall within this range, the cell to be read, the selected or target cell, will produce a cell current in a read operation. The presence of cell current flow indicates that the cell is in an erased state (logic "1") rather than a programmed state (logic "0").

Cell current is produced in an erased cell because the voltage applied to the control gate, by way of the word line from the array connected to the X decoder 20, will exceed the threshold voltage of the erased cell by a substantial amount. In addition, cells which are not being read, the deselected cells, are prevented from producing a cell current even if such cells have been erased to a low threshold voltage state. By way of example, for cells located in the same row as the selected cell, by definition, share the same word line as the selected cell. However, the drains will be floating thereby preventing a cell current from being generated. Deselected cells in the same column will not conduct cell current because the word lines of such deselected cell are typically grounded. Thus, the gate-source voltage of these cells will be insufficient to turn on these deselected cells even if they are in an erased state.

Once the array 12 has been erased, the vast majority of cells will have a proper erased threshold voltage. However, it is possible that a few of the cell, or even one, may have responded differently to the erase sequence and such cells have become overerased. If a cell has been overerased, the net charge on the floating gate will be positive. The result will be that the threshold voltage will be negative to some extent. Thus, when the word line connected to such overerased deselected cells is grounded, the deselected cells will nevertheless conduct current. This current will interfere with the reading of the selected cell thereby preventing proper memory operation. A principal objective of the erase sequence of FIGS. 4A and 4B is to prevent the overerase condition from occurring.

Returning to the FIGS. 4A and 4B flow chart, the erase sequence is initiated (element 64) by the issuance of the two above-noted erase commands. Once the commands have been received by the command execution logic 16, the internal state machine 19 will first cause all of the cells of the array 12 to be programmed. This is done so that all cells are in essentially the same condition when they are subsequently erased. This reduces the likelihood that one or more of the cells will become overerased since all of the cells will have an increased tendency to respond to the subsequent erase sequence in the same manner. As indicated by block 66, an address counter 23 (FIG. 1) is initialized to the first address of the memory. Next, as indicated by block 68, the voltages used for programming are set to the proper level, including setting high voltage $V_{PP}$ to +12 volts (element 21 of FIG. 1).

Once the voltages are set, an internal program pulse counter (not depicted) is initialized as shown by block 70. This counter will keep track of the number of programming pulses that have been applied to the cells of the word (byte) being programmed. Next, a programming pulse is applied to the cells of the word located at the first address of the memory, as indicated by block 72. The pulse counter is then incremented (block 74) and a determination is made as to whether a predetermined maximum number of pulses have been applied to the cells (element 76). If that is the case, the cells are read to determine whether the cells have, in fact, been programmed (78). This is accomplished using the sense amplifiers and associated components represented by block 33 of FIG. 1.

If the cells are still not programmed at this point, there has been a failure since he maximum number of programming pulses has been exceeded. Depending upon the particular memory, the sequence will be terminated or a record of the failed word will be made and the sequence continued. This information will then be transferred to the status register 25 (FIG. 1) so that it can be read by the processor. One potential cause of such a failure is that the memory endurance may have been exceeded. In other words, the memory has been cycled too many times.

Assuming that the maximum count has not been exceeded, the byte is verified as indicated by element 80. If the byte has not been programmed, a further programming pulse is applied (block 72) and the counter is incremented (block 74). Assuming that the maximum count has still not been exceeded, the byte is again verified (element 80). This sequence will continue until the byte finally passes the verification test or until the pulse counter is at the maximum.

Assuming that the first byte is eventually successfully programmed, a determination is made as to whether the last address of the array 12 has been programmed (element 82). Since that is not the case, the address counter 23 (FIG. 1) will be incremented to the second address (block 84) and the internal pulse counter reset (block 70). A first programming pulse will be applied to the byte of the second address (block 72) and the sequence will be repeated. This process will continue until all cells of the array 12 have either been programmed or until a determination is made that there is a programming failure.

Assuming that all of the cells have been successfully programmed and verified, the state machine 19 will continue the erase sequence by setting the appropriate voltages used for erasing, including the initialization of the address counter 23 (block 86 of FIG. 4) and the setup of the appropriate voltages for erasing, including voltage $V_{PP}$ (block 88).

Next, an internal erase pulse counter is reset (block 90) and a single erase pulse is applied to all of the cells of the array (or to the block of the array being erased) The cells of the array will then be sequentially read in order to determine whether all cells have been successfully erased. First, the conditions necessary for erase verification, namely those for cell reading, are set up (block 94) and the first cell of the Array is read.

A single erase pulse is almost never sufficient to accomplish an erasure so that this test (element 96) will almost always fail. The state of the erase pulse counter is then examined (element 98) and a determination is made that the maximum count has not been exceeded. Accordingly, a second erase pulse is applied to the entire array 12 (element 92) and the first byte is again tested (element 96).

Once the byte has received a sufficient number of erase pulses and has passed the verification test (element 96), the address is incremented (block 98) and the second byte is tested (elements 94 and 96) to determine whether the second byte has been successfully erased. Since the cells are not always uniform, it is possible that the second byte has not be erased even though it has received the same number of erase pulses received by the first byte. In that event, a further erase pulse is applied to the entire array 12 and the second byte is again tested for a proper erase. Note that the address is not reset at this point since it is not necessary to retest those bytes that have already been erased. However, there is a possibility that those earlier erased bytes will become overerased, as will be explained.

Once it has been established that the second byte has been properly erased, a determination is made as to whether the last address of the Array has been verified (element 100). Since that is not the case, the address counter 23 is incremented (element 102) and the third byte is tested. Additional erase pulses will be applied if necessary. The internal erase pulse counter (element 98) will monitor the total number of erase pulses applied in the erase sequence. If a maximum number has been exceeded, the sequence will be terminated and one of the bits of the status register 25 will be set to reflect that an erase error has occurred.

Assuming that the second byte of cells has been properly erased, the remaining bytes will be verified and any necessary additional erase pulses will be applied. Once the last address has been verified, the erase sequence is ended and the status register 25 is updated to indicate that the erase sequence has been successfully completed.

Although not shown in the FIG. 4 flow chart, many memory systems provide operations for reducing the distribution of the erased threshold voltages and for correcting for cells which have been overerased. This is done by a process sometimes referred to as a heal operation. In a heal operation, the array bit lines are left open and the source lines are grounded. A high voltage, typically +12 volts, is applied to all of the word lines of the array 12. The high voltage is applied in the form of a pulse, with the heal operation typically requiring application of multiple pulses. These conditions will cause electrons to be transferred to the floating gates of all of the cells of the array thereby increasing the threshold voltage. Cells which have been overerased will have a higher amount of charge transferred to them so that their threshold voltage will be increased more than the other cells. This process will move the overerased threshold voltage from a negative value to a positive value. Since the cells having negative threshold voltages (overerased cells) and those having small positive threshold voltages will be affected more than other cells, this process will have a tendency to reduce the voltage distribution of all of the cells and to correct for the overerased cells.

As previously described, the sense amplifiers are used for sensing voltages indicative of flash memory cell current under different operating conditions. The present invention permits these various reference voltages used by the sense amplifiers for comparison to the sensed voltages to be adjusted or trimmed after memory fabrication is completed. Thus, it is possible to optimize these reference voltages to take into account the particular characteristics of the memory system as determined after fabrication.

Figure 5:
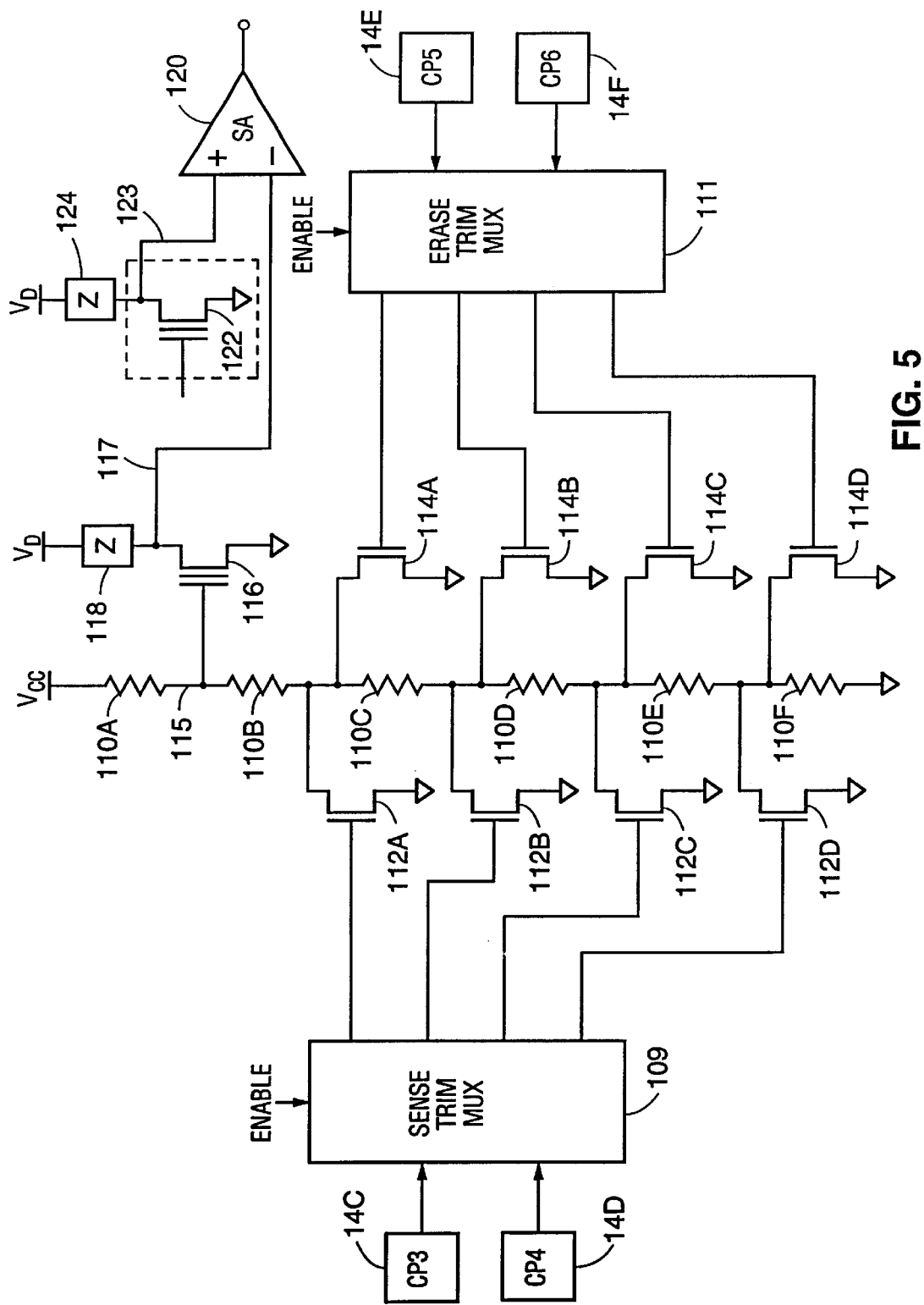
FIG. 5 is a schematic diagram of part of the subject memory system showing circuitry relating to the control of the sense amplifier reference based upon stored control parameters.

Referring to FIG. 5, the diagram depicted shows exemplary circuitry for optimizing the reference voltages of the FIG. 1 memory system. Two reference voltages to be used by the sense amplifier are produced, one for use when the memory cells are being read in a normal read operation and as part of a programming operation to confirm that the cells have been properly programmed (program verification). This voltage is referred to as the sense trim reference voltage and is applied to the inverting input of sense amplifier 120. The second reference voltage is used in erase operations, as will be described, and is referred to as the erase trim reference voltage.

In the read mode, the word line connected to the gate of the cell 122 being read is connected to +5.5 volts. If the cell has been programmed, this word line voltage will be below the programmed threshold voltage of the cell and essentially no cell current will flow. If the cell is in an erased state, the word line voltage will exceed the threshold voltage and significant cell current will flow. As will be explained, the cell current is converted to a corresponding voltage which is compared with the sense trim reference voltage.

If a cell 122 (cell 122 is a cell in array 12 which is addressed by address counter 23) is being read as part of the program verification, the sense trim reference voltage is also applied to the inverting input of the sense amplifier 120. However, the word line voltage applied to the cell being read is increased to about +7.5 volts, a level which exceeds the programmed threshold voltage. This will cause the cell 122 being verified to conduct a current indicative of the programmed threshold voltage level. This cell current will be converted to a voltage which is applied to the non-inverting input of the sense amplifier 120.

In the event an erase verification is to take place, an erase trim reference voltage is applied to the inverting input of sense amplifier 120. A word line voltage of typically +5.5 volts is applied to the control gates of the cells 122 being verified. This will result in a cell current indicative of the erased threshold voltage of the cells. The cell current is converted to a voltage which is compared to the erase trim reference voltage.

The erase and sense trim reference voltages can be adjusted by controlling the state of two programmable control parameters for each voltage. The level of the sense trim reference voltage is adjusted using control parameters CP3 and CP4 (FIG. 5) stored in non-volatile data storage units 14C and 14D, respectively. The erase trim reference voltage is adjusted using control parameters CP5 and CP6 stored in non-volatile data storage units 14E and 14F.

Parameters CP3 and CP4 are coupled to a sense trim multiplexer 109 which uses the two input bits CP3 and CP4 to enable one of four possible outputs when the multiplexer 109 is enabled during read and program verification operations. An enabled multiplexer output is set to a high level and a disabled output is set to a low level. Thus, when a read or a program verification is taking place, the erase trim multiplexer 111 is disabled so that all four of the multiplexer 111 outputs are at a low or disabled state.

A selected one of four N channel transistors 112A–112D will be turned on by a selected output of multiplexer 109 depending upon the state of parameters CP3 and CP4. Transistors 112A–112D are connected to various nodes of a resistive divider which includes resistors 110A–110F connected in series between a supply voltage $V_{cc}$ and the memory common. The magnitude of the voltage at node 115 of the resistive divider can thus be altered depending upon which one of transistors 112A–112D is made conductive by control parameters CP3 and CP4. Depending upon the relative sizes of resistors 110A–110F, the control parameters can function to provide a very small but accurate trim or a larger but less accurate trim in the voltage at node 115.

The voltage at node 115 is connected to the control gate of a reference flash cell 116. Flash cell 116 is set to a U.V. erased state so that there is no net charge present on the floating gate of the cell. A load 118 is connected between the drain of the reference cell 116 and a voltage $V_D$. The node 117 intermediate the drain of cell 116 and the load 118 is connected to the inverting input of a sense amplifier 120.

When a selected cell 122 is being read, the control gate (word line) voltage is set to +5.5 volts, which will exceed the threshold voltage of an erased cell, but will not exceed the threshold voltage of a programmed cell. The voltage at node 123 will be at one of two levels depending upon whether the cell is erased or programmed. The reference voltage at node 117 is set midway between these two levels utilizing control parameters CP3 and CP4 so as to minimize the error margin when the cell is read by the sense amplifier 120.

When a selected cell 122 is being verified for programming, the sense voltage at node 117 will be the same as in the read operation. However, as previously noted, word line voltage applied to cell 122 is set to a large value (+7.5 volts) so that the programmed cell, which has a high threshold voltage, will conduct a current. This current will result in a voltage change at node 123 depending upon the programmed threshold voltage of the cell. The reference trim sense voltage at node 117 is set to a level to correspond to some maximum amount of programmed cell 122 current. Thus, the sense amplifier 120 output will go high if the cell being verified has not been adequately programmed.

When an erase verification operation is taking place, the sense trim multiplexer is disabled so that all four transistors 112A–112 D are turned off. A selected one of the erase trim multiplexers 111 outputs will be turned on depending on the state of control parameters CP5 and CP6. This will cause a selected one of the four N channel transistors 114A–114D to turn on thereby changing the voltage at node 115 of the resistive divider. This will cause the erase trim voltage at node 17 to be altered based upon the parameters CP5 and CP6.

The eased cell 122 being verified will conduct a cell current since the voltage applied to the word line, +5.5 volts will exceed the erased threshold voltage. The resultant cell current will be indicative of the erased threshold voltage of the cell, with such current resulting in a drop in voltage on node 123. If node 123 drops below the magnitude of the erase trim reference voltage at node 117, the cell has been adequately erased and the output of sense amplifier 120 will go low. Although two control parameters are used for adjusting the sense trim reference voltages, three or more parameters could be used to increase the adjust range.

Voltage Adjust

The primary supply voltage $V_{cc}$ for a typical memory system is nominally +5 volts. However, larger magnitude voltages are generated for carrying out various memory operations. For example, when a block of cells is to be erased, the source line connected to the cell sources located in the block is raised to a large positive voltage of typically +12 volts. As a further example, when a cell is being programmed, the word line associated with the cell is raised to +12 volts. As previously noted, when a program verification operation is taking place, the word line is typically raised to +7.5 volts. The voltage trim feature can be used in other memory applications. For example, the word line voltage used in the previously-described heal cycle, which is nominally +12 volts, can be made adjustable using the control parameters. As a further example, the voltage applied to the bit lines in programming operations, typically +6 volts, can be made adjustable.

Figure 6:
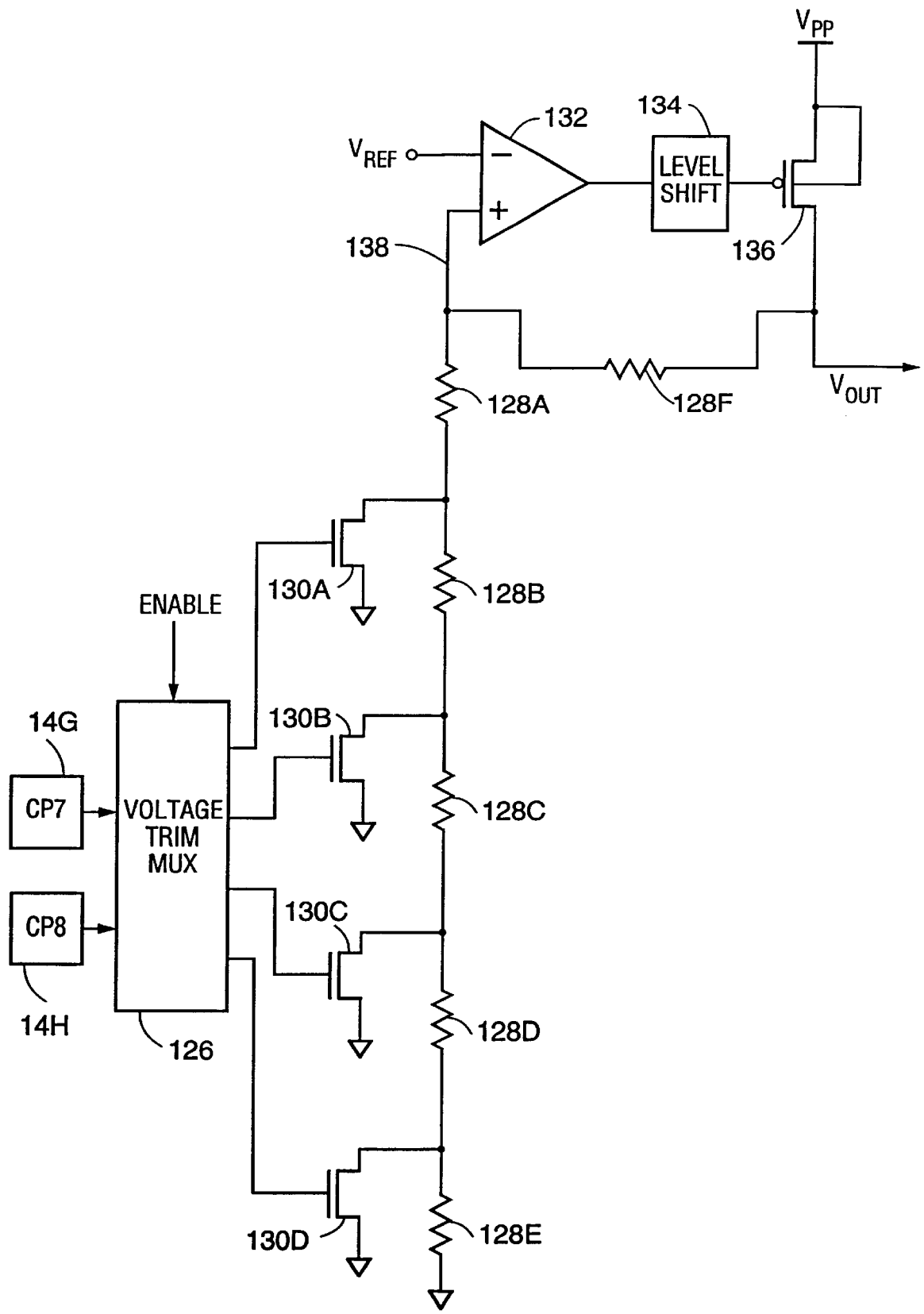
FIG. 6 is a schematic diagram of part of the subject memory system showing circuitry relating to the control of the magnitude of the high voltages used in memory operations based upon stored control parameters.

The present invention permits the magnitudes of these voltages to be adjusted to compensate for the particular characteristics of the memory as determined after fabrication. For example, one wafer of integrated memory circuits may contain cells which require +10.5 volts be applied to the source region during an erase operation while circuits from another wafer may require +11.5 volts for the same operation to meet the timing specification for the part. FIG. 6 shows one circuit which can be used to control the magnitude of various memory voltages in response to stored control parameters. These include, for example, the voltage pulse applied to the array word lines during program operations, to the array word lines during heal operations and to the source lines of array blocks during erase operations. In the example depicted, the stored parameters are CP7 and CP8 which are stored in data storage units 14G and 14H, respectively. These parameters are used to control a voltage trim multiplexer 126 having four outputs, one of which is made active (high) depending upon the state of parameters CP7 and CP8. If greater trim range is desired, the number of control parameters can be increased to four or more parameters.

The four outputs of multiplexer 126 are coupled to four separate N channel transistors 130A–130D. Transistors 130A–130D are connected to various nodes of a resistive divider which includes resistors 128A–128D. The resistive divider is connected to the non-inverting input of a comparator circuit 132, with the inverting input connected to reference voltage $V_{REF}$. The output of comparator circuit 132 is connected to the gate of a P channel transistor 136 by way of a level shifting circuit 134. A feedback resistor 128F is connected between the drain of transistor 136 and the non-inverting input of comparator circuit 132. The drain of transistor 136 also functions as the voltage output $V_{OUT}$ of the circuit, with the source of transistor being connected to voltage $V_{PP}$ which is typically +12 volts.

In operation, comparator circuit 132, level shifter 134 and P channel transistor 136 form a feedback circuit so that the voltage at node 138 the non-inverting input of comparator circuit 132 is forced to be equal to that at the non-inverting input connected to voltage $V_{REF}$. The output voltage $V_{OUT}$ at the drain of transistor 136 can approach voltage $V_{PP}$ of +12 volts, with the low voltage output of comparator circuit 132 output being capable of providing gate drive to transistor 136 by virtue of the level shifting circuit 134.

Multiplexer 126 is enabled so that a selected one of transistors 130A–130D will be turned on based upon the values of control parameters CP7 and CP8. Feedback provided, as explained, which will function to maintain the voltage at node 138 equal to voltage $V_{REF}$. Since the voltage across the resistive divider 128A–128E is fixed at $V_{REF}$, the current flow through the divider will be a function of the effective resistance of the divider as determined, in part, by which of transistors 130A–130D is turned on. Thus, the current flow will be larger when transistor 130A is on as compared to when transistor 130B is turned on.

The current through the resistive divider 128A–128E will also flow through the feedback resistor 128F so that the voltage $V_{OUT}$ will be equal to voltage $V_{REF}$ plus the voltage drop across resistor 128F. Transistor 136 will provide sufficient current drive capability so that the various memory operations requiring substantial current can be performed. Depending upon the requirements of the memory system, the FIG. 6 circuit is provided where control over a memory voltage is desired after fabrication is completed.

Pulse Width Adjust

As previously noted, voltages are applied to the flash memory cells in order to perform various memory operations including programming and erasing. In addition to controlling the magnitude of such voltages, the present invention permits the duration that the voltages are applied to be adjusted. By way of example, in a program operation, a large positive voltage $V_{PP}$ of typically +12 volts is applied to the word line of the cell being programmed. Programming is accomplished by applying the voltage in the form of periodic pulses, with the duration of each of the pulses typically being on the order of a few microseconds. The magnitude of the programming pulses and duration of the pulses required to program a cell may vary depending upon the particular characteristics of the cell. Circuitry for adjusting the magnitude of the voltage using stored control parameters has been previously described. Now, circuitry for adjusting the duration of the pulses used in memory operations, including programming pulses, will now be described.

Figure 7:
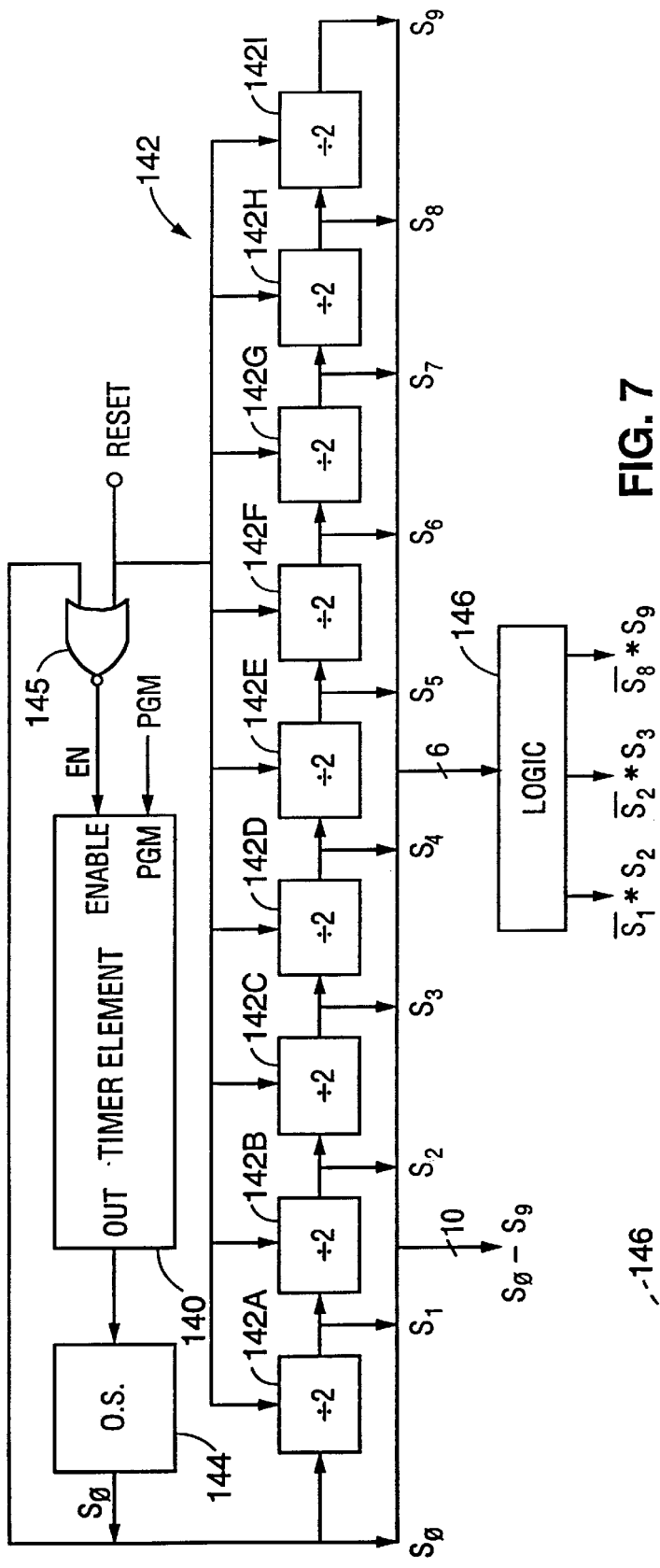
FIG. 7 is a block diagram of part of the circuitry used to generate timing decodes which are selected to vary the duration of the pulses used in memory operations.

FIG. 7 shows a timing circuit for producing various decodes which may be used to control the duration of voltage pulses. Further details regarding the timing circuit are disclosed in Ser. No. 08/509,035, now issued as U.S. Pat. No. 5,629,644 entitled ADJUSTABLE TIMER CIRCUIT. The contents of this application are hereby fully incorporated herein by reference.

The FIG. 7 circuit includes a timer element 140 which provides an output pulse a fixed time period after having been triggered by an enable signal Reset. The output of the timer element 140 is forwarded to a one shot circuit 144 which produces an narrow output pulse $S_0$ at the end of the fixed time period provided by timer element 140. The output $S_0$ is fed back to the enable input of the timer element 140 through NOR gate 145 so that the circuit will retrigger itself and provide successive output pulses S0 that are spaced apart a fixed duration. A program signal PGM is provided to timer element 140 and is used to switch the time period between outputs $S_0$ to a long duration of about one-half a millisecond when certain non-programming memory operations are to be performed and to a shorter duration on the order on one microsecond when programming memory operations are to be performed.

The output of one shot 144, signal $S_0$, is also coupled to the input of a counter 142 which has nine stages 142A–142I. Each stage includes a D type flip-flop having an output connected back to the input so as to provide a divide-by-two function. The counter 142 thus produces nine timing outputs $S_1$–$S_9$ which are forwarded to various decoding circuitry. The counter 142 stages are each reset by signal Reset. The decoding logic includes a logic block 146 which receives five of the timing signals ($S_1$, $S_2$, $S_3$, $S_8$ and $S_9$) from counter 142. The logic block 146 logically combines the six timing signals to provide three decoded outputs including $\overline{S}_1{}^*S_2$, $\overline{S}_2{}^*S_3$ and $\overline{S}_8{}^*S_9$ (*=AND). As will be explained in greater detail, these outputs are selected to provide certain desired predetermined output pulse widths for carrying out memory operations such as programming.

Figure 9:
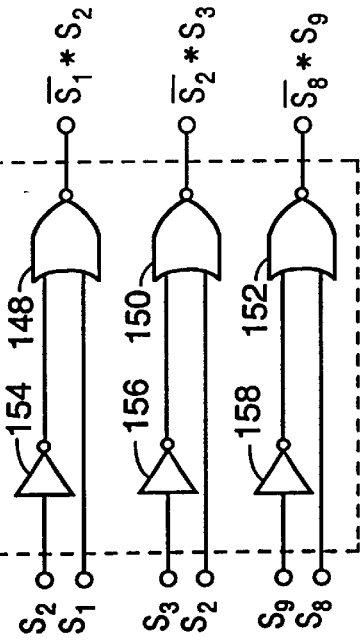
FIG. 9 is a schematic diagram of circuitry for logically combining the decodes generated in the FIG. 7 diagram.

FIG. 9 shows the implementation details of the logic block 146. The block includes three NOR gates 148, 150 and 152 and three inverters 154, 156 and 158. The six timing signals SN are coupled to the appropriate inputs to the logic gates to provide the three outputs. By way of example, timing signal $S_2$ is connected to inverter 154, the output of which is connected to one input of NOR gate 148. Timing signal $S_1$ is connected to the second input of the NOR gate 148 the output of which is signal $\overline{S}_1$ and $S_2$ ANDed together ($\overline{S}_1{}^*S_2$).

The memory system 10 of FIG. 1 utilizes a total of three types of pulses used in memory operations. Pulses are provided for programming operations, erasing operations and healing operations. The heal operation requires the voltage pulses applied to the word lines to have a duration on the order of those used in memory erase operations. Thus, the timer element 140 is placed in the non-program state (PGM inactive) when heal operations are to be performed.

Figure 8:
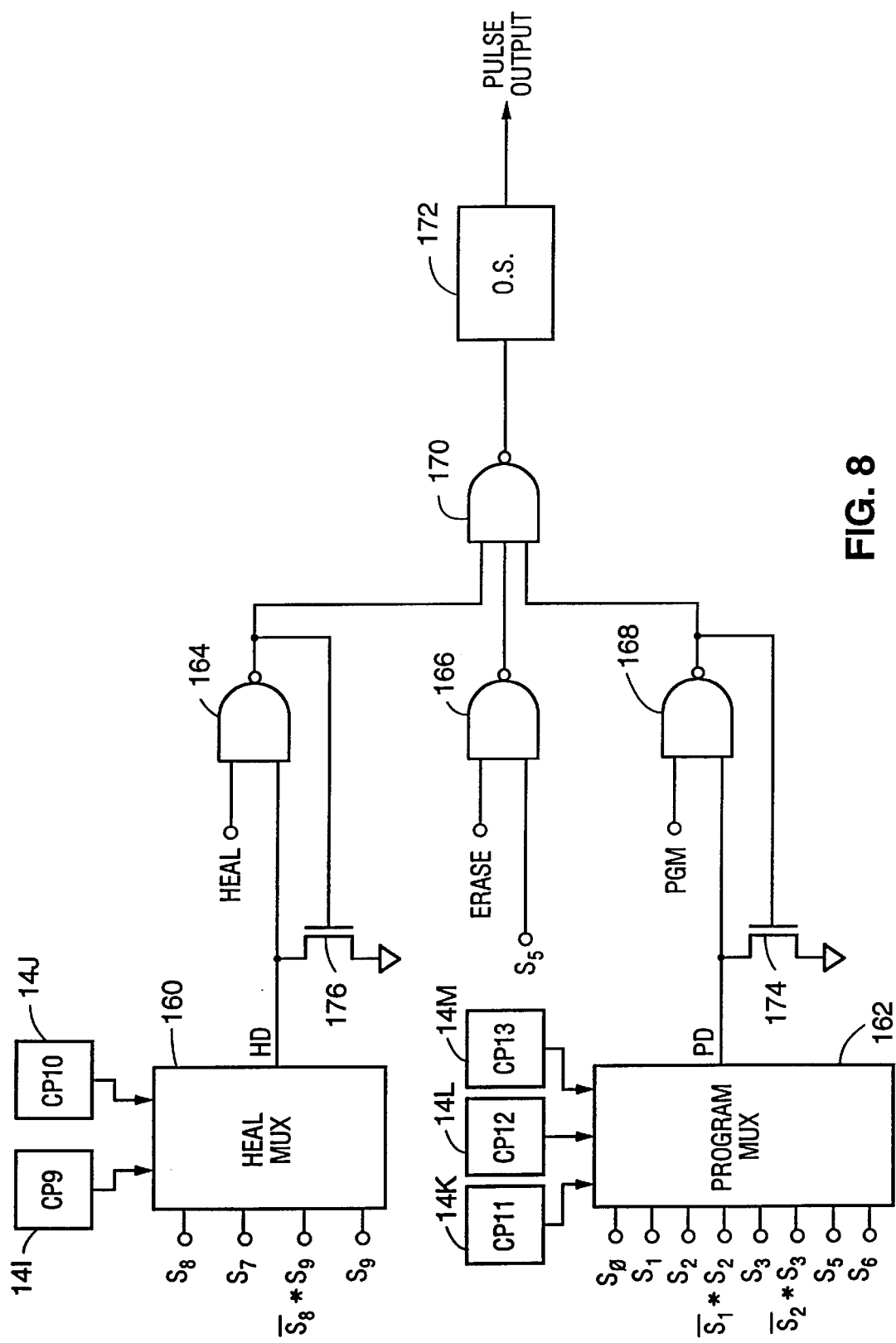
FIG. 8 is a schematic diagram showing circuitry used to select the decodes generated in the FIG. 7 diagram for generating differing pulse durations based upon stored control parameters.

FIG. 8 depicts the circuitry for generating the particular pulses used in the programming, erasing and heal memory operations. The duration of the erase pulses in the present example are fixed. The memory erase operation timing signal is not adjustable in the disclosed exemplary embodiment. Decode $S_5$, taken directly from stage 142E of counter 142, is connected to one input of a two-input NAND gate 166. The second input is connected to a signal ERASE which is active when a memory Erase operation is to be performed. The output of gate 166 is connected to one input of a three input NAND gate 170. The falling output of gate 170 functions to trigger a one shot 172 causing a sort duration (50 nanoseconds) pulse to be produced thereby indicating the end of the erase pulse. During an erase operation, signal PGM is inactive so that the timer element 140 will output a pulse $S_0$ having a duration of 0.4 milliseconds. Decode $S_5$ will provide an output $2^5$ (32) times the period of the output pulse $S_0$ period of 0.4 milliseconds.

The duration of the individual pulses used in heal operations are controlled by way of control parameters CP9 and CP10 stored in data storage units 14I and 14J, respectively. The duration of the pulses used in programming operations are controlled by way of control parameters CP11, CP12 and CP13 which are stored in data storage units 14K, 14L and 14M, respectively.

The heal pulse widths are adjustable and can range from 50 milliseconds to 200 milliseconds. The particular pulse width is based upon the value of two bits of stored control parameters CP9 and CP10. Table 1 below shows the four combinations of parameters CP9 and CP10 and the corresponding decodes and pulse durations. A heal multiplexer 160 is used to select one of four possible decodes based upon the two parameters CP9 and CP10.

The output HD of heal multiplexer 160 is connected to one input of two-input NAND gate 164. The second input to the NAND gate 164 is a signal Heal which is produced by the memory system when the

TABLE 1

| DECODE (Heal) | | PULSE WIDTH |
|---|---|---|
| CP9 | CP10 | (milliseconds) |
| 0 | 0 | 100 |
| | | [$S_8$] |
| 0 | 1 | 50 |
| | | [$S_7$] |
| 1 | 0 | 150 |
| | | [$\overline{S_8} * S_9$] |
| 1 | 1 | 200 |
| | | [$S_9$] | memory system is performing a heal operation. The output of gate 164 is connected to a second input of three-input NAND gate 170. Thus, when signal Heal is active, one shot 172 is triggered by a selected one of the four possible heal decodes.

The decode circuitry further includes a program multiplexer 162 used to select one of eight possible decodes for use in memory program operations. The selected decode is based upon parameters CP11, CP12 and CP13 stored in storage units 14K, 14L and 14M, respectively. Table 2 below shows the eight combinations of parameters CP11, CP12 and CP13 and the corresponding output pulse widths used in memory programming operations.

TABLE 2

| DECODE (program) | | | PULSE WIDTH |
|---|---|---|---|
| CP11 | CP12 | CP13 | (microseconds) |
| 0 | 0 | 0 | 6 |
| | | | [$S_2$] |
| 0 | 0 | 1 | 4.5 |
| | | | [$\overline{S_1} * S_2$] |
| 0 | 1 | 0 | 3 |
| | | | [$S_1$] |
| 0 | 1 | 1 | 1.5 |
| | | | [$S_0$] |
| 1 | 0 | 0 | 9 |
| | | | [$\overline{S_2} * S_3$] |
| 1 | 0 | 1 | 12 |
| | | | [$S_3$] |
| 1 | 1 | 0 | 48 |
| | | | [$S_5$] |
| 1 | 1 | 1 | 96 |
| | | | [$S_6$] |

The output PD of the program multiplexer 162 is connected to one input of a two-input NAND gate 168, with the second input being connected to receive an active signal PGM when the memory is to perform a program operation. The decode is forwarded by way of gate 170 to one shot 172 and triggers the one shot on its falling edge. Thus, depending upon the stored parameters CP11, CP12 and CP13, the program pulse outputs will vary as set forth in Table 2 above.

Figure 10:
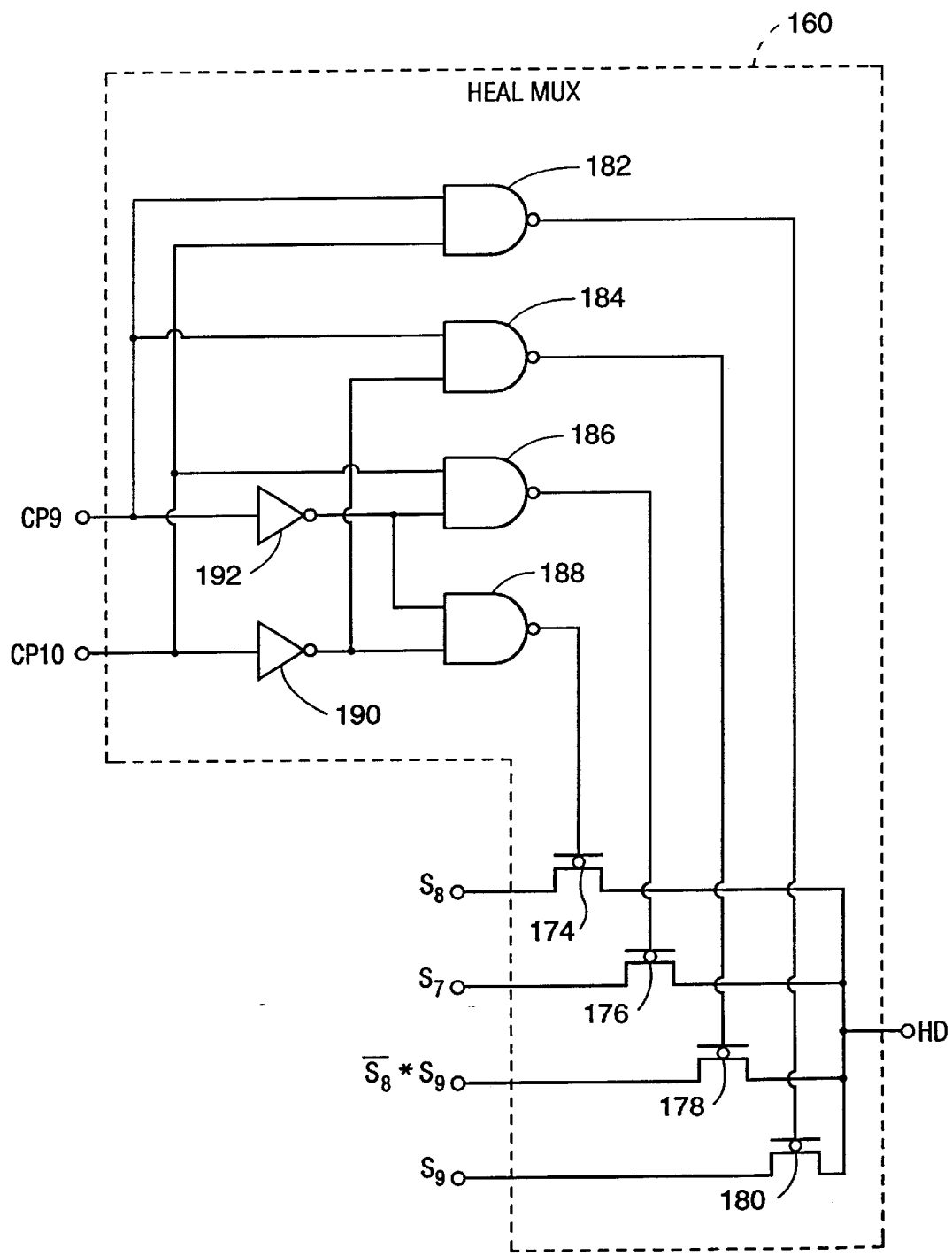
FIG. 10 is a schematic diagram showing circuit details of one of the multiplexers used in the FIG. 8 diagram.

FIG. 10 shows a schematic diagram of the heal multiplexer 160. The Program multiplexer 162 is implemented in a similar manner. The multiplexer 160 includes four P channel pass transistors 174, 176, 178 and 180 which are selectively enabled depending upon the stored parameters CP9 and CP10 so as to pass the selected decode to the output HD of the multiplexer. Four NAND gates 182, 184, 186 and 188 and two inverter 190 and 192 are used for decoding the parameters CP9 and CP10 and for enabling one of the four NAND gates 182, 184, 186 and 188 based upon the parameters. By way of example, if the parameters CP9 and CP10 are logic "0" and "1", respectively, both inputs to NAND gate 186 will be a logic "1" so that the logic "0" (low) output of gate 186 will turn pass transistor 176 on. Transistor 176 will forward decode S 7 to the multiplexer output HD. The other NAND gates 182, 186 and 188 will all have high (logic "1") outputs under these conditions.

When one or both of the multiplexers 160 and 162 are coupling a low logic level signal, the output of the multiplexers (HD or PD) will be at one threshold voltage above ground due to the fact that the pass transistors include only P channel devices rather than both P and N channel devices. Small geometry transistors 174 and 176 (FIG. 8) are provided for pulling the multiplexer outputs down to approximately ground level under these conditions so that the multiplexer outputs HD and PD are at the proper low level. Transistors 174 and 176 are rendered conductive by the high outputs of NAND gates 168 and 164, respectively, with the outputs of these gates being high when the outputs of the respective multiplexers 162 and 160 are at one threshold voltage above ground potential.

The heal control parameters CP9 and CP10 and the program control parameters CP11, CP12 and CP13 are selected after the memory system has been fabricated and characterized so as to optimize the performance of the memory system. By way of example, a particular lot of memory integrated circuits may be such that the flash memory cells of the memory array can be most efficiently programmed by application of a pulse of 9 microsecond duration. This would typically be determined at the memory test facility. In that event, the parameters CP11, CP12 and CP13 would be selected to be "1", "0" and "0", respectively as indicated by Table 2. These value will be permanently programmed into the three non-volatile flash memory cells of the data storage units 14K, 14L and 14M at the fabrication facility. If, for example, preliminary evaluation of a subsequent lot of memory integrated circuits indicates that the optimum pulse duration for programming is 100 microseconds, all that is required is to program 1, 1 and 1 for parameters CP11, CP12 and CP13, respectively, as indicated by Table 2.

Figure 11:
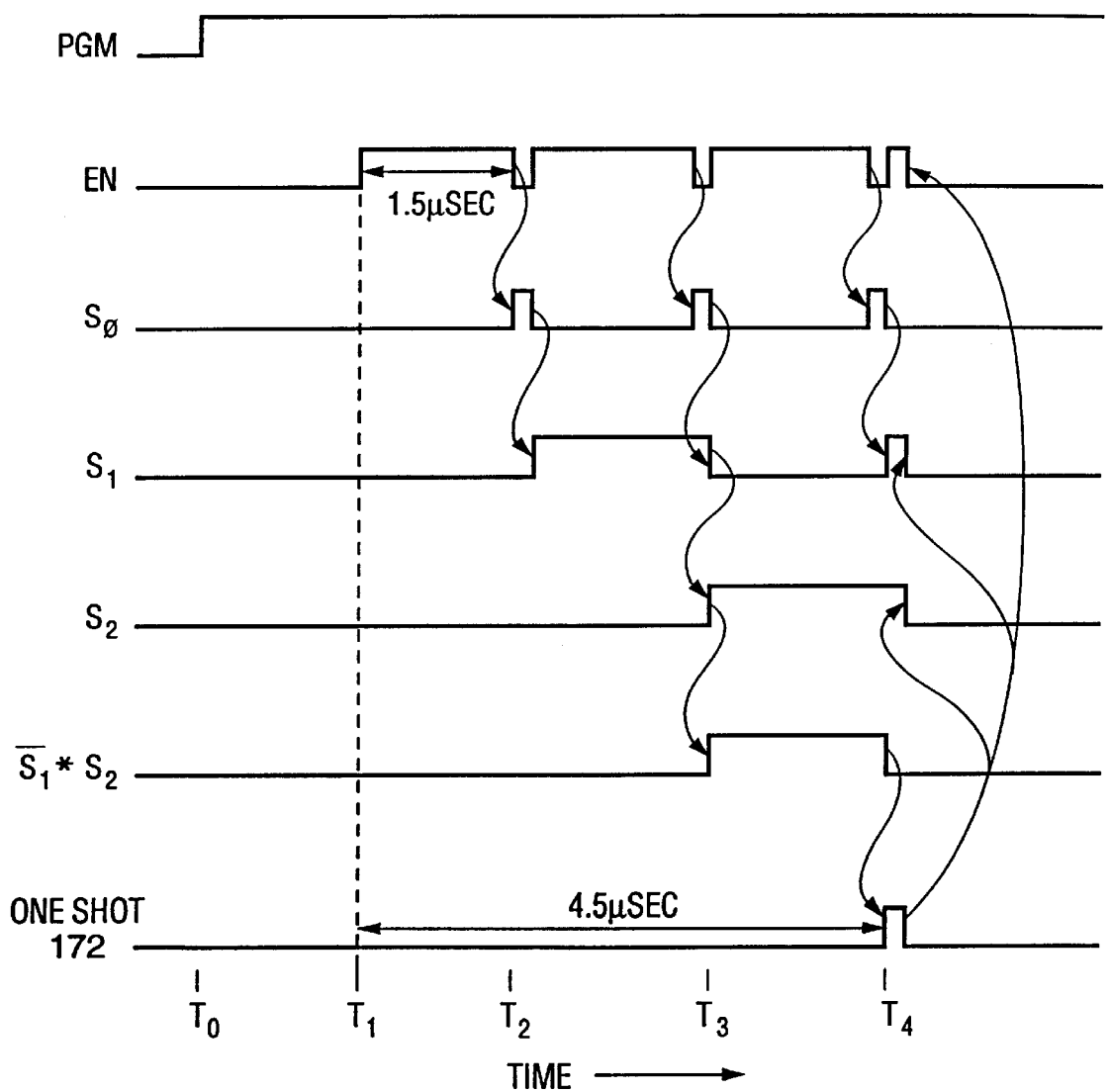
FIG. 11 is a timing diagram illustrating the manner in which an exemplary programming pulse is generated.

FIG. 11 is a timing diagram which further illustrates the operation of the subject invention. The diagram shows the manner in which the 4.5 microsecond pulse is produced in a programming operation. As indicated in Table 2, the stored parameters CP11, CP12 and CP13 are "0", "0" and "1", respectively for producing a programming pulse of this duration. At time $T_0$, signal PGM is made active thereby indicating that one of programming outputs of Table 2 is to be produced. The stored parameters (block 162 of FIG. 8) will cause multiplexer 162 to select decode $\overline{S_1}*S_2$.

At time $T_1$, signal EN is made active (high) by the generation of reset signal Reset (FIG. 7). Timer element 140 contains a timing capacitor which will proceed to be charged at this point. This is the beginning of the generation of the 4.5 microsecond timing pulse, at which time the programming voltages are applied to the flash memory cell being programmed.

At time $T_2$, the timing capacitor has reached a final value causing the timer element 140 to issue an output which will cause one shot circuit 144 to issue a pulse in the form of signal $S_0$. Signal $S_0$ is fed back to the timer element by way of NOR gate 145 to generate a subsequent signal EN. The time period from the falling edge of EN at time $T_0$ to the rising edge of the next signal EN (or the rising edge of signal $S_0$) is 1.5 microseconds. This sequence is periodically repeated so that subsequent signals $S_0$ are produced at time $T_3$, $T_4$, etc.

Signal $S_0$ clocks counter 142, with counter output $S_1$ changing states at the falling edge of signal $S_0$ thereby providing a signal with a nominal period of 3 microseconds as can be seen in the FIG. 11 diagram. Similarly, counter output $S_2$ changes state on the falling edge of output $S_1$ thereby providing a signal with a nominal period of 6 microseconds. The logical combination of $\overline{S}_1 * S_2$ is equivalent to subtracting 1.5 microseconds (signal $\overline{S}_1$) from 6 microseconds (signal $S_2$) to arrive at the final 4.5 microsecond value. The falling edge of the decode $\overline{S}_1 * S_2$ out of multiplexer 162 triggers one shot 172 by way of gates 168 and 170. Thus the rising edge of the one shot 172 (or the falling edge of decode $\overline{S}_1 * S_2$) represents the termination of the 4.5 microsecond time period.

Data Storage Unit

The non-volatile data storage units 14 for storing the control parameters CP can be implemented in many forms. One manner of implementing the data storage units is disclosed in the previously noted U.S. Pat. No. 5,682,345 entitled NON-VOLATILE DATA STORAGE UNIT AND METHOD OF CONTROLLING SAME.

Figure 12:
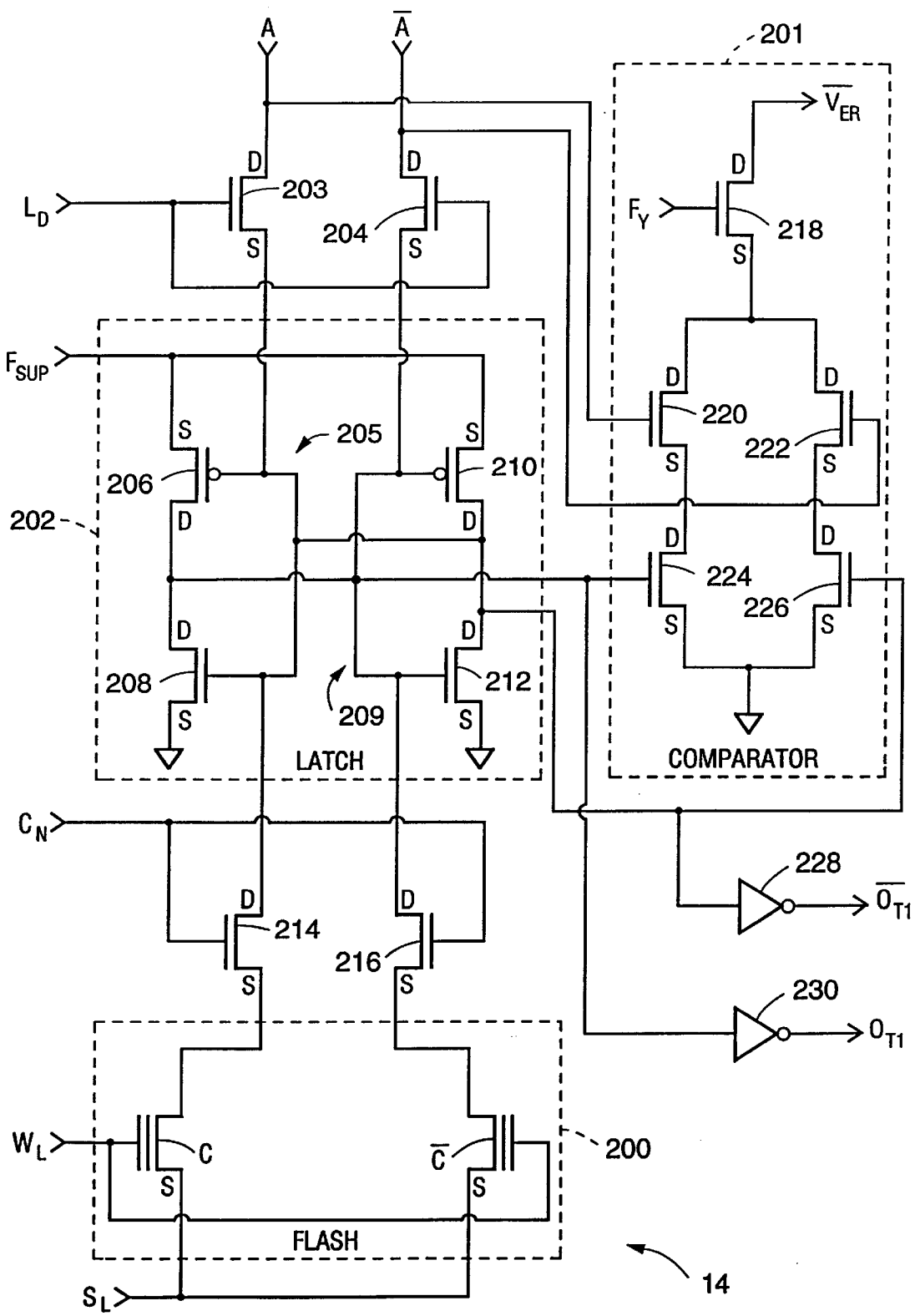
FIG. 12 is a schematic diagram of a data storage unit used for storing the control parameters.

FIG. 12 is a detailed schematic diagram of a data storage unit 14 suitable for use in connection with the present invention for storing the control parameters CP. The data storage unit is capable of storing a single bit of control parameter data. Multiple bits can be stored by simply providing a separate storage unit 14 for each bit. The storage unit includes a non-volatile memory or flash section 200, a volatile latch section 202 and a comparator section 201. The flash section includes a pair of flash memory cells C and $\overline{C}$ for storing one bit of control parameter data in complementary form. As is well known, a flash cell utilizes a floating gate transistor having a drain, source, floating gate and control gate. Data is stored in the cell by adding or removing charge from the floating gate. Erasure is accomplished by removing charge by way of Fowler-Nordheim tunneling from the floating gate through a thin gate oxide disposed intermediate the floating gate and the cell channel. The flash cells have their common source regions connected to a common source line which receives signal $S_L$ and their control gates connected to a common word line which receives signal $W_L$.

The latch section 202 includes a pair of cross-coupled inverters which form a latch circuit. A first inverter 205 includes a P channel transistor 206 connected in series with an N channel transistor 208. The common drain connections of transistors 206 and 208 form the output of the inverter and the common gate connection form the input. The second inverter 209 includes a P channel transistor 210 connected in series with an N channel transistor 212. The common drain connection of transistors 210 and 212 form the output of the second inverter 209 and the common gate connection forms the input.

As previously noted, the two inverters of the latch section 202 are connected to form a latch circuit. In particular, the output of the first inverter 205, the common drain connection of transistors 206 and 208, is connected to the input of the second inverter 209, the common gate connection of transistors 210 and 212. The output of the second inverter 209, the common drain connection of transistors 210 and 212, is connected back to the input of the first inverter 205, the gates of transistors 206 and 208.

The output of the first inverter 105 of the latch section 202 is connected to the drain of flash cell $\overline{C}$ by way of a N channel transistor 216 and the output of the second inverter 209 is connected to the drain of flash cell C by way of N channel transistor 214. The gates of the two connect transistors 214 and 216 are connected to a common control line which carries signal $C_N$.

The latch section 202 is powered by applying a voltage $F_{SUP}$ to the sources of transistors 206 and 210. As will be explained, the magnitude of the voltage $F_{SUP}$ can be controlled by conventional circuitry, the details of which are not described since they are conventional and form no part of the present invention.

Data to be loaded into the latch section 202 is provided in complementary form A and $\overline{A}$ by way of N channel transistors 203 and 204. The common gates of the transistors 203 and 204 are connected to a line which receives a load signal $L_D$. Transistor 203 functions to couple data input A to the input of the first inverter 205 of latch section 202 and transistor 204 functions to couple data input $\overline{A}$ to the input of the second inverter 209.

The two complementary outputs of the latch section 202 are coupled to respective inverters 228 and 230. The outputs of inverters 228 and 230 form the complementary outputs $\overline{O}_{T1}$ and $O_{T1}$ of the subject data storage unit. The outputs of the latch section 202 are also coupled to respective inputs of a comparator circuit 201. The data inputs A and $\overline{A}$ are also coupled to respective inputs of the comparator circuit 201. As will be explained, the comparator circuit 201 functions to compare the data stored in the latch section 202 with the data inputs A and $\overline{A}$ so that the state of the latch section can be verified. Typically, the output of the comparator section 201, signal $\overline{V}_{ER}$ is wire ORed to other comparator sections 201 associated with other data storage units so that a single verification signal $\overline{V}_{ER}$ can be used to indicate whether there is a match between the contents of the latch section 202 and the associated data inputs A and $\overline{A}$ among several of the subject storage units.

Comparator section 201 includes five N channel transistors 218, 220, 224, 222 and 226. Transistor 218 is coupled between the comparator output $\overline{V}_{ER}$ and the common drain connection of transistors 220 and 222. In addition, the gate of transistor 218 is connected to receive signal $F_V$ which is active when the state of the comparator section 201 is to be sampled. Transistors 220 and 224 are connected in series, with the gate of transistor 224 connected to receive data input A and the gate of transistor 224 connected to receive the output of the first inverter 205 of latch section 202. Similarly, transistors 222 and 226 are connected in series, with the gate of transistor 222 connected to receive data input $\overline{A}$ and the gate of transistor 226 connected to receive the output of the second inverter 209 of latch section 202. As will be explained, when the complementary data inputs A and $\overline{A}$ match the complementary outputs of the two latch section inverters, the output of the comparator circuit 201, $\overline{V}_{ER}$ will be high, otherwise the output will be low.

There are a total of five operations which the subject storage unit 14 can perform, including Load, Erase, Program, Recall and Verify. These operations will each be described in connection with the timing diagram of FIG. 13 together with the schematic diagram of FIG. 12. As will be explained in greater detail, the flash cell C and $\overline{C}$ are programmed by first loading the programming data into the latch section 202. In addition, the flash cells C and $\overline{C}$ are read by transferring the contents of the flash cells to the latch section 202.

Load

The function of the Load cycle is to set the latch section 202 to a known state based upon the complementary input data A and $\overline{A}$. The Load operation is required prior to the Program operation to ensure that the latch circuit 202 is at the desired state.

The beginning of the Load cycle is indicated by time $T_0$. Following time $T_0$, the input data A and $\overline{A}$ is applied to the drains of transistors 203 and 204. Once the input data are stabilized, the load signal $L_D$ is made active thereby turning on transistors 203 and 204. In addition, the latch section 22 supply voltage $F_{SUP}$ is maintained at its nominal primary supply voltage $V_{CC}$ level of +5 volts. Assuming, for example, that A is a high level, the input of the first inverter 205, the common gates of transistors 206 and 208 will be pulled up to a high level. At the same time, complementary signal $\overline{A}$ will be at a low level and will tend to pull the input of the second inverter 209, the gates of transistors 210 and 212, down to a low level by way of load transistor 204.

This combined opposing action on the inputs of the two inverters will force the output of the first inverter 205 to a low state and the output of the second inverter 209 to a high state. The latch section 202 will hold or store this data until it is altered by a subsequent Load operation, until it is changed by a Recall operation (as will be explained) or until the power is removed from the system. Load transistors must be of sufficient size so as to be capable of forcing the latch section 202 transistors to the desired state.

Erase

The operation for erasing the flash cells C and $\overline{C}$ commences at time $T_1$. This cycle is performed directly on the cells rather than by way of the latch section 202. The connect signal $C_N$ is inactive in this operation so that both connect transistors 214 and 216 will be non-conductive. Thus, the drains of cells C and $\overline{C}$ will be left floating. In addition, signal $W_L$ connected to the word line of the two cells is grounded and the signal $S_L$ connected to the sources of the two cells is raised to a large positive voltage such as +12 volts. As is well known, under these conditions, the cells C and $\overline{C}$ will both be erased by way of Fowler-Nordheim tunneling. The flash section 200 must then be appropriately programmed so that t he cells C and $\overline{C}$ will store complementary data.

Program

The Programming cycle commences at time $T_2$. As previously noted, the latch section 202 must have been previously set to the desired programmed state of the flash section 10. Load signal $L_D$ is inactive so that transistors 203 and 204 are off. The supply voltage $F_{SUP}$ is at a nominal value of +6 volts. Assume, for example, that the latch section 202 had previously been set such that the output of inverter 205 is at a low level and the output of inverter 209 is at a high level. In that event, the drain of transistor 214 will be close to the supply voltage $F_{SUP}$ and the drain of transistor 216 will be close the circuit common.

The connect signal $C_N$ is made active (high) shortly after time $T_2$, thereby turning on transistors 214 and 216 and effectively connecting the supply voltage $V_{SUP}$ and circuit common to the drain of cells C and $\overline{C}$, respectively. The connect signal $C_N$ switches to a high level of +12 volts in the Programming cycle so that transistors 214 and 216 have a sufficient gate-source voltage to connect the supply voltage $F_{SUP}$ of +6 volts to either one of the drains of cells C and $\overline{C}$ depending upon the data stored in the latch. In this case, cell C will get the $F_{SUP}$ on its drain. At the same time, the control gates of the cells C and $\overline{C}$ are connected to word line signal $W_L$ having a magnitude equal to +12 volts. In fact, in many cases $C_N$ and $W_L$ can be the same signal. The source line signal $S_L$ is at circuit common and is connected to the common sources of cells C and $\overline{C}$. This combination of voltages applied to cell C will cause the cell to be programmed whereas those applied to cell $\overline{C}$ will not result in programming of the cell. In order to enable the cells C and $\overline{C}$ to be programmed to opposite states, it is necessary to first erase both cells in an Erase cycle prior to performing the Programming cycle. As previously noted, the latch section 202 must have also been previously set in order to carry out a Programming cycle.

Transistor 210 of inverter circuit 209 will provide the programming current, which is typically 500 microamperes, to cell C. If cell $\overline{C}$ is being programmed, the programming current is provided by transistor 206 of inverter circuit 205. Thus, transistors 206 and 210 of the latch section 202 must be of sufficient size to be able to conduct these programming currents. As previously noted, transistors 203 and 204 must also be sized so that they have sufficient strength to force transistors 206 and 210 to a desired state during the Load cycle. Typically, the programming voltages will be applied for a relatively long duration ranging from a few hundred microseconds to a millisecond. Since the data is stored in cells C and $\overline{C}$ in complementary form and since, as will be explained, the cells will be read in a differential manner, there is a large error tolerance margin. Accordingly, it is not necessary to perform any type of program verification as is frequently done in flash memory systems to confirm that the data has been properly programmed.

Recall

Figure 13:
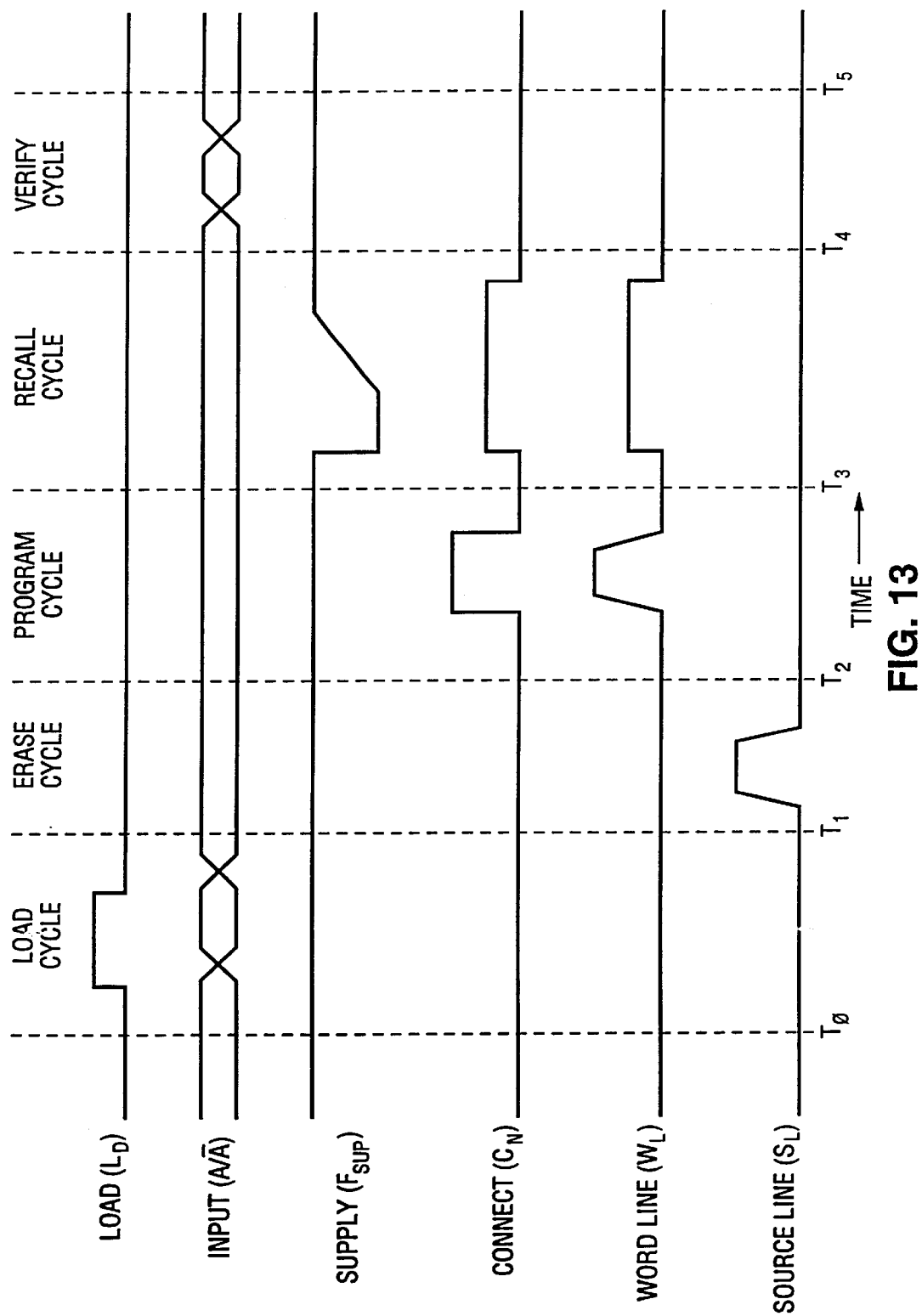
FIG. 13 is a timing diagram illustrating the various functions that can be carried out by the FIG. 12 data storage unit.

The Recall cycle is illustrated in the FIG. 13 diagram beginning at time $T_3$. In this operation, the complementary states of cells C and $\overline{C}$ are transferred to the latch section 202. When power is removed from the data storage unit 14, the data is not retained in volatile latch section 202. Accordingly, when power is reapplied, initialization circuitry is used to cause the transfer of the data stored in the non-volatile cells C and $\overline{C}$ to the latch section 202.

Since the flash cells C and $\overline{C}$ have a limited drive capability and would not normally have sufficient strength to force the transistors of the latch section 202 to a desired state, the supply voltage $V_{SUP}$ is momentarily dropped to a low level approaching ground potential in the initial stage of the Recall operation. In addition, the connect signal $C_N$ is made active thereby connecting the flash section 200 to the latch section 202 by way of transistors 214 and 216. The word line of cells C and $\overline{C}$ is connected to a signal $W_L$ having a magnitude equal to the primary supply voltage $V_{CC}$ of typically +5 volts. Again, signals $W_L$ and $C_N$ can be the same signal for this operation.

The Recall cycle is preferably initiated by some form of power-on-reset circuit which will cause the Recall cycle to be performed at power on and when the primary supply voltage $V_{CC}$ drops to some predetermined level which would possibly affect the state of the latch section 202. The Recall cycle is initiated by the power-on-reset circuit when the circuit has detected that the primary supply voltage $V_{CC}$ has ramped up to about +3 volts after initial power on or has ramped up to about +3 volts after a drop in voltage $V_{CC}$ below that level.

During the Recall cycle, the common source line signal $S_L$ is also set to ground potential. Assuming that cell C has been programmed and cell $\overline{C}$ is in an erased state, cell C will be non-conductive so that the input of inverter 205 of the latch section 202 will not be affected. Cell $\overline{C}$ will be conductive and tend to pull the input of inverter 209 of the latch section 202 down to ground potential.

Since the latch section 202 is not powered at this point, cell $\overline{C}$ is capable of pulling the input of inverter 209 down to a low level despite the limited drive capability of the cells. As can be seen from the FIG. 13 timing diagram, voltage $V_{SUP}$ is held to a low value momentarily and then is increased to the normal operating level. Preferably, the voltage is increased at a slow rate.

As the supply voltage $V_{SUP}$ increases, the cell $\overline{C}$ will continue to hold the input of inverter 209 at a low level so that P channel transistor 210 will proceed to turn on. This will cause the output of inverter 209 to be high which will, in turn, cause the input of inverter 205 to also be high. Thus, transistor 208 of inverter 205 will also begin to turn on thereby causing the output of inverter 205 to go low thereby reinforcing cell $\overline{C}$ in pulling down the input of inverter 209. Eventually, the supply voltage $V_{SUP}$ will be at the normal high voltage of $V_{CC}$ or typically +5 volts and the latch section 202 will be in the desired state of indicating the state of the flash section 200.

Even though cell $\overline{C}$ has a very small drive capability, by controlling the supply voltage $V_{SUP}$ as described, the cell is capable of forcing the latch section 202 to the desired state. Programmed cell C will not have much, if any, tendency to pull the input of inverter 205 down and thus will not oppose the action of cell $\overline{C}$. However, even if the programmed threshold voltage of cell C approached the erased threshold voltage of cell $\overline{C}$, it can be seen that the cell with the largest cell current will still be able to control the state of the latch section 202. This differential action enhances the reliability of the operation of the subject data storage unit. Note also that the outputs of inverters 205 and 209 are coupled to respective inverters 228 and 230 so that loading on the latch section outputs will be equal. The latch section will thus remain capacitively balanced so as to enhance the ability of the flash cells C and $\overline{C}$ to force the latch section to any desired state.

Verify

As previously explained, the Verify cycle is used to determine the state of the latch section 202. This operation can be used to determine the state of the flash section 200 if it preceded by a Recall cycle. The Verify cycle utilizes the complementary data inputs A and $\overline{A}$ and compares them with the state of the latch section 202. Comparator section 201 functions essentially as an exclusive NOR circuit and provides a logic low output $\overline{V}_{ER}$ in the event there is a match between the latch section 202 and the data input A and $\overline{A}$.

By way of example, assume that a Verify cycle is to take place so that the verify signal $F_V$ is made active. This will cause transistor 218 of the omparator section 201 to be conductive. Further assume that data input A is a logic "1" (high) so that $\overline{A}$ is a logic "0" (low). Still further assume that inverter 205 output of the latch section 202 is a logic "0" so that the inverter 209 output will be a logic "1". Since input A is high and since the output of inverter 205 is low, transistor 220 of the comparator 201 section will be conductive and transistor 224 will be off. Similarly, since input $\overline{A}$ is low and the output of inverter 209 is high, transistor 222 will be off and transistor 226 will be on. There is a pull-up device (not depicted) connected between the output of the comparator section 201 and voltage $V_{CC}$. As a result of transistors 224 and 222 being off, there will be no conductive path between the source of transistor 218 and the circuit common. Accordingly, the output $\overline{V}_{ER}$ will remain in a high state ("1") indicating a valid compare.

If the outputs of inverters 205 and 209 were logic "1" and "0", respectively, and the data inputs A and $\overline{A}$ remain the same, transistors 220 and 224 will both be conductive. Thus, when transistor 218 is turned on by signal $F_V$, the output $V_{ER}$ will be pulled down to a logic "0" indicating a no compare condition.

In the event the data inputs A and $\overline{A}$ are a logic "0" and "1", respectively, and the outputs of inverters 205 and 209 are a logic "1" and "0", respectively, transistors 220 and 226 will be off. Thus, signal $V_{ER}$ will be a logic "1" thereby indicating a valid compare. Continuing, if inputs A and $\overline{A}$ were a logic "0" and "1", respectively and inverters 205 and 209 were a logic "0" and "1", respectively, transistors 222 and 226 will be conductive so that signal $\overline{V}_{ER}$ will be at a logic "0", thereby indicating a no compare.

The various operations for programming the control parameters CP in the data storage units 14 are typically performed when the memory system is placed in a non-user mode of operation such as a test mode of operation. Circuitry for sensing when the memory system is to be placed in a test mode of operation and for placing the system in that mode of operation is disclosed in U.S. Pat. No. 5,526,364 entitled APPARATUS FOR ENTERING AND EXECUTING TEST MODE OPERATIONS FOR MEMORY. The contents of such application are hereby fully incorporated into the present application by reference.

Figure 14:
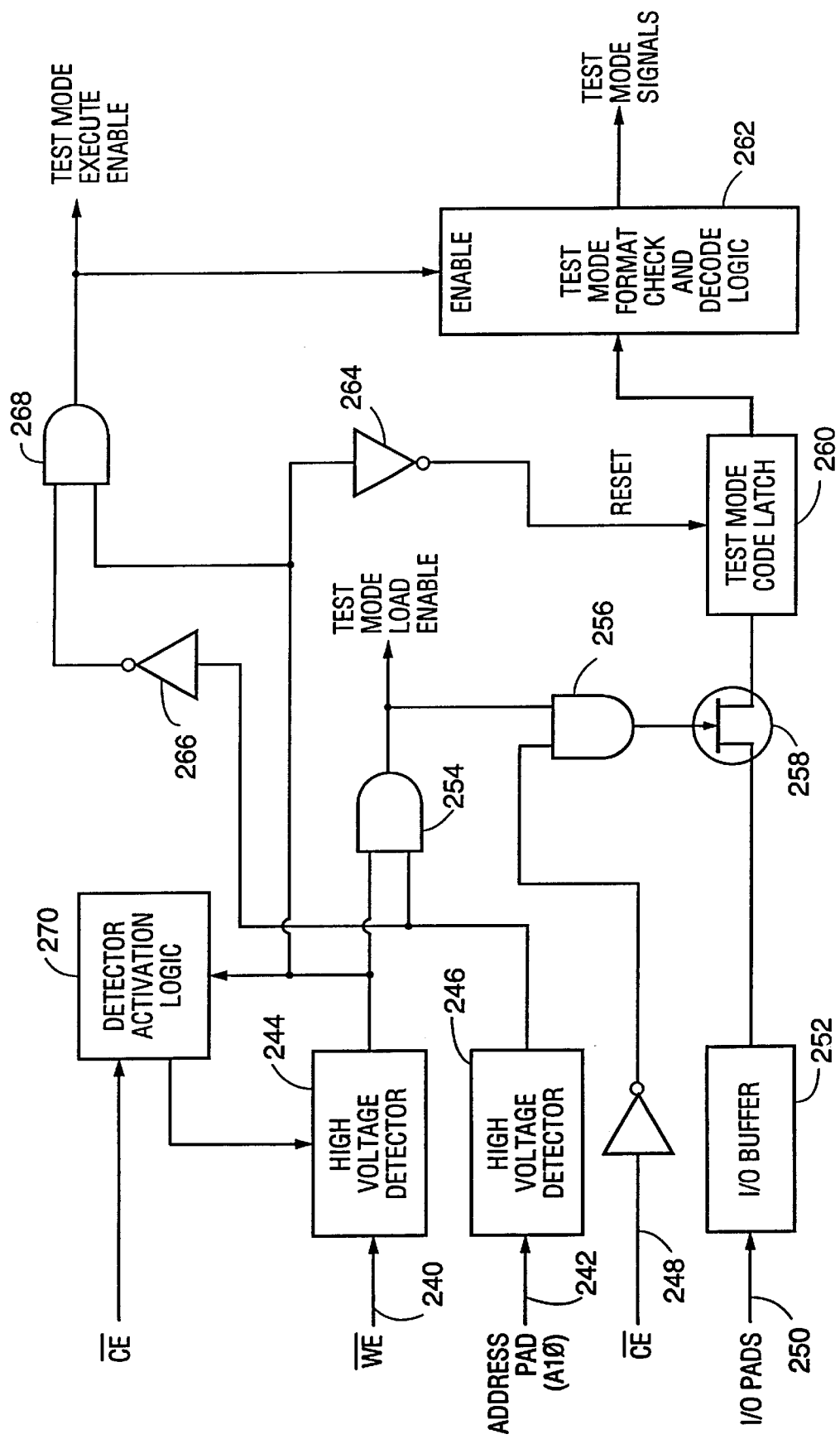
FIG. 14 is a block diagram of a circuit used for detecting when the subject memory system has been placed in a test mode and for determining which test mode has been detected.

FIG. 14 depicts one embodiment of a circuit for entering and executing test mode operations. Among other things, test mode commands must be applied to the data I/O terminals of the memory to indicate which one of various test modes is to be entered. Typically, the end user of the memory system would have no reason to cause the memory system to enter the test mode since this mode is intended to be used by the memory fabrication facility. Furthermore, accidental entry into the test mode is to be avoided since the memory could be rendered permanently inoperable in this mode. Thus, the test mode circuitry is designed to specifically reduce the likelihood of accidental entry into the test mode by requiring simultaneous application of high voltages to multiple memory system terminals.

The FIG. 14 circuit is activated by application of a high voltage to two or more terminals 240 and 242 of the memory system from an external source. These terminals are non-dedicated terminals used during normal memory operations. Terminals 240 and 242 may include, for example, address terminal (pad) A10 and the write enable terminal $\overline{WE}$. The magnitude of the high voltage applied to terminals 240 and 242 is chosen to be outside of the range of voltages which would typically be applied to those terminals during use of the terminals in normal (non-test mode) operation of the memory system. This is done to prevent an end user from unintentionally entering the test mode. The high voltage applied to terminals 240 and 242 is detected by detectors 244 and 246. A suitable detector circuit is disclosed in Ser. No. 08/493,162, now issued as U.S. Pat. No. 5,723,990 entitled INTEGRATED CIRCUIT HAVING HIGH VOLTAGE DETECTION CIRCUIT, the contents of which are hereby fully incorporated into the present application by reference.

After application of the high voltage to terminals 240 and 242, a signal on another terminal 248, in this case the chip enable $\overline{CE}$ terminal, is made active (low). Test code data corresponding to one of several possible test modes is placed on the data I/O terminals 250 of the memory and forwarded to an I/O buffer 252.

An AND gate 254 provides an test mode load enable signal when the outputs of both high voltage detectors 244 and 246 indicate the a high voltage is being applied to the two terminals 240 and 242. The load enable signal is coupled to one input of an AND gate 256 together with an inverted signal $\overline{CE}$. This causes AND gate 256 to turn on pass transistor 258 which will forward the test code data to buffer 252 and then to a test mode code latch 260. Separate I/O terminals and pass transistors 258 are used for each bit of input test mode data so that the data will be loaded into latch 260 in parallel. Typically there are a total of eight bits of test code data so that latch 260 will contain eight bits. Signal $\overline{CE}$ is then brought back to a high state thereby latching the test code data in latch 260.

After latch 260 has been loaded with the test code data, one of high input voltages, such as the input to address A10 terminal 242 is removed so that the output of detector 246 will go low thereby providing a high input to an AND gate 268 by way of inverter 266. Since the remaining input of gate 268, the output of the second high voltage detector 244, will still be high, gate 268 will produce a test mode enable signal. Among other things, this will enable a Test Mode and Format Check and Decode Logic unit 262 which will verify that the data in latch 260 corresponds to one of various proper test modes. In addition, unit 262 will decode the test mode code to determine which one of approximately fifteen different memory test modes has been entered. These test modes each have an associated test mode signal which is produced by the Test Mode and Format Check and Decode Logic unit 262 and which is used by the memory system in combination with other signals for carrying out the various test mode functions.

The system will remain in the selected test mode as long as the voltage applied to terminal 240 remains high. When signal $\overline{CE}$ was brought back to a high state, detector activation logic 270 keeps the detection circuits 244 and 246 enabled as long as the voltage applied to terminal 240 remains high. During the course of carrying out the various test modes operations, it is necessary to periodically change the state of the chip enable $\overline{CE}$ signal. However, since address A10 on line 242 has been shifted to a low state, the low output of AND gate 256 will prevent any change in the contents of the test mode code latch. Once test mode operation is completed, the high voltage applied to terminal 240 is removed thereby causing the output of AND gate 268 to go low thereby ending test mode operation.

The test mode codes loaded into latch 260 are preferably of a specific format thereby further reducing the possibility of accidental entry into a test mode. The test mode code is typically divided into two groups of bits, with the first group of bits, the format bits, signifying a test mode operation and the remaining bits signifying a particular one of the test modes. In the present exemplary embodiment, there are three test mode relating to the control of the data storage units 14. These test modes are defined in the test mode code stored in latch 260. The first of these test modes relates to control parameters used to control the operation of the state machine 19 (FIG. 1). Details as to the manner the state machine operation is controlled is described in patent Ser. No. 08/508,921, now issused as U.S. Pat. No. 5,619,453, entitled MEMORY SYSTEM HAVING PROGRAMMABLE FLOW CONTROL REGISTER. The contents of this application are hereby fully incorporated into the present application by reference.

The second category of these storage unit test modes relates to the control of the memory addressing as previously described in connection with FIG. 3 and the control of the word width (bus width) in memory as previously described in connection with FIG. 1. The third category of the storage unit test modes relates to the trim functions previously described in connection with FIGS. 5–11. These trim functions permit the magnitude and duration of various voltage pulses used in memory operations to be altered using the stored control parameters.

A typical memory system may utilize a large number of data storage units for controlling various aspects of the operation of the memory. There are typically approximately two dozen storage units associated with the trim function category. As previously described in connection with FIGS. 12 and 13, the data storage units are each capable of performing five basic cycle types as follows: (1) Load; (2) Erase: (3) Program; (4) Recall and (5) Verify. In order to be able to effectively control these data storage units using non-dedicated memory terminals requires specialized circuitry as will now be described.

Figure 15A:
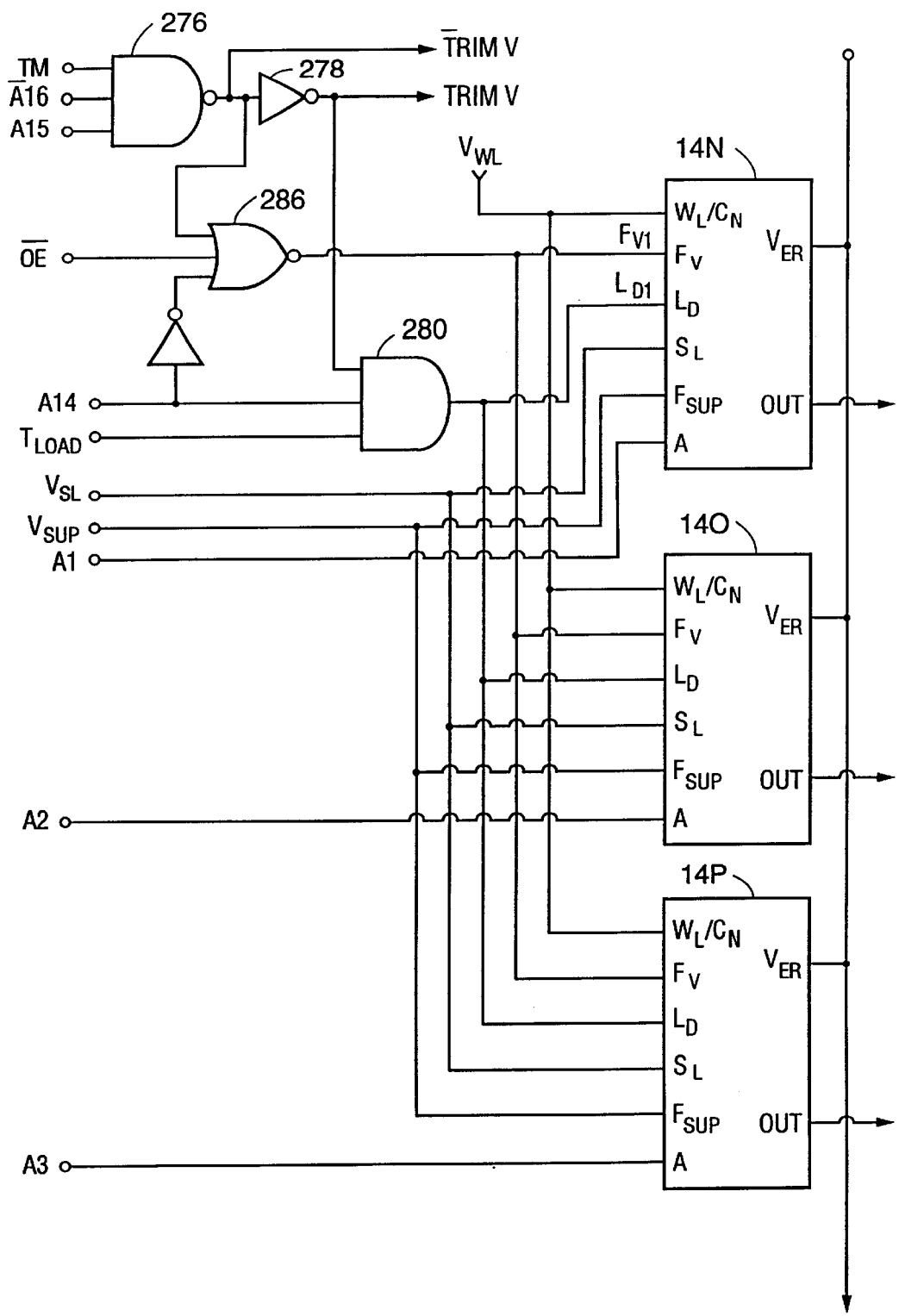
FIGS. 15A–15C are schematic diagrams showing nine exemplary data storage units and some of the associated circuitry for controlling the storage units.
Figure 15B:
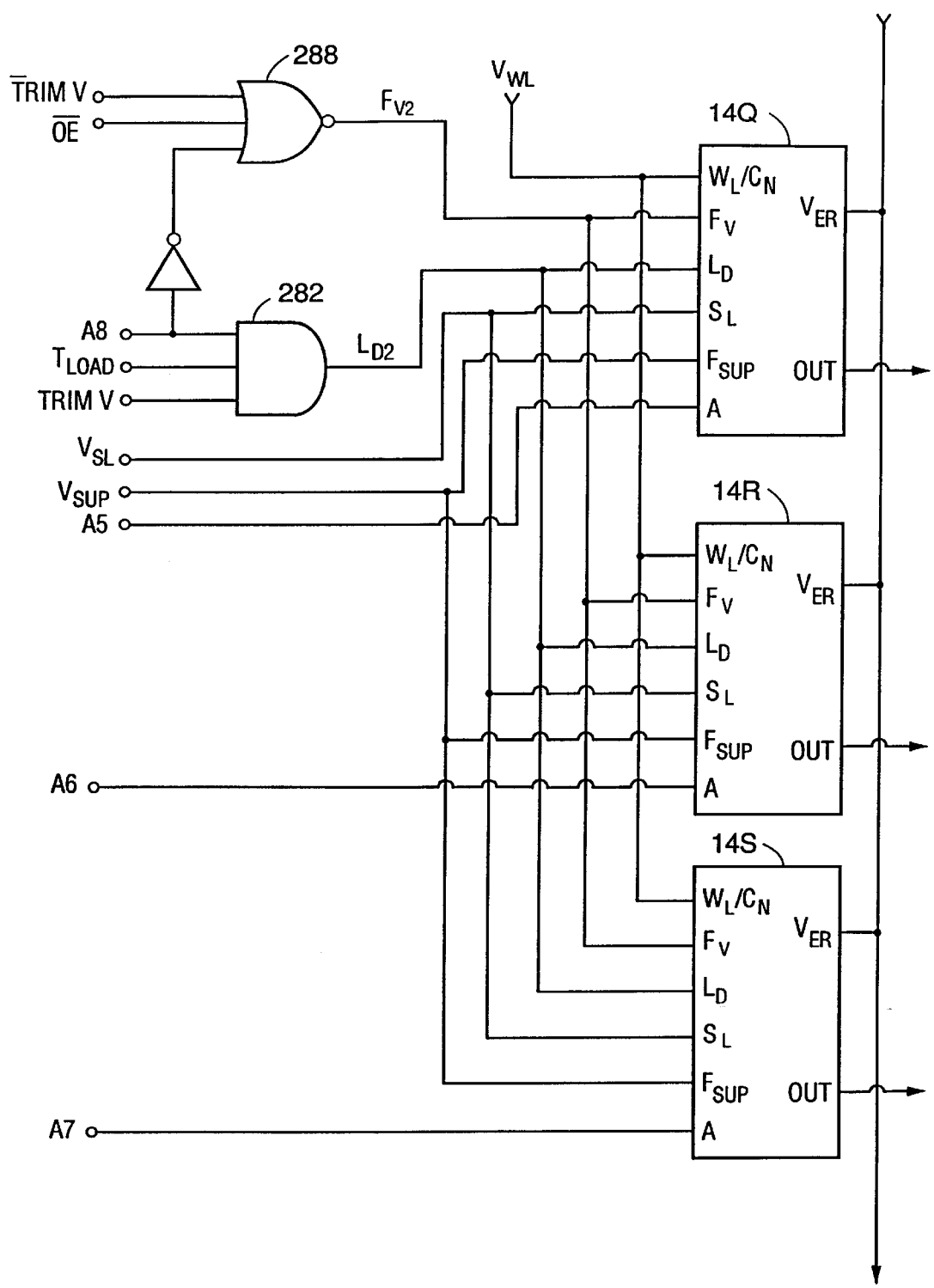
Figure 15C:
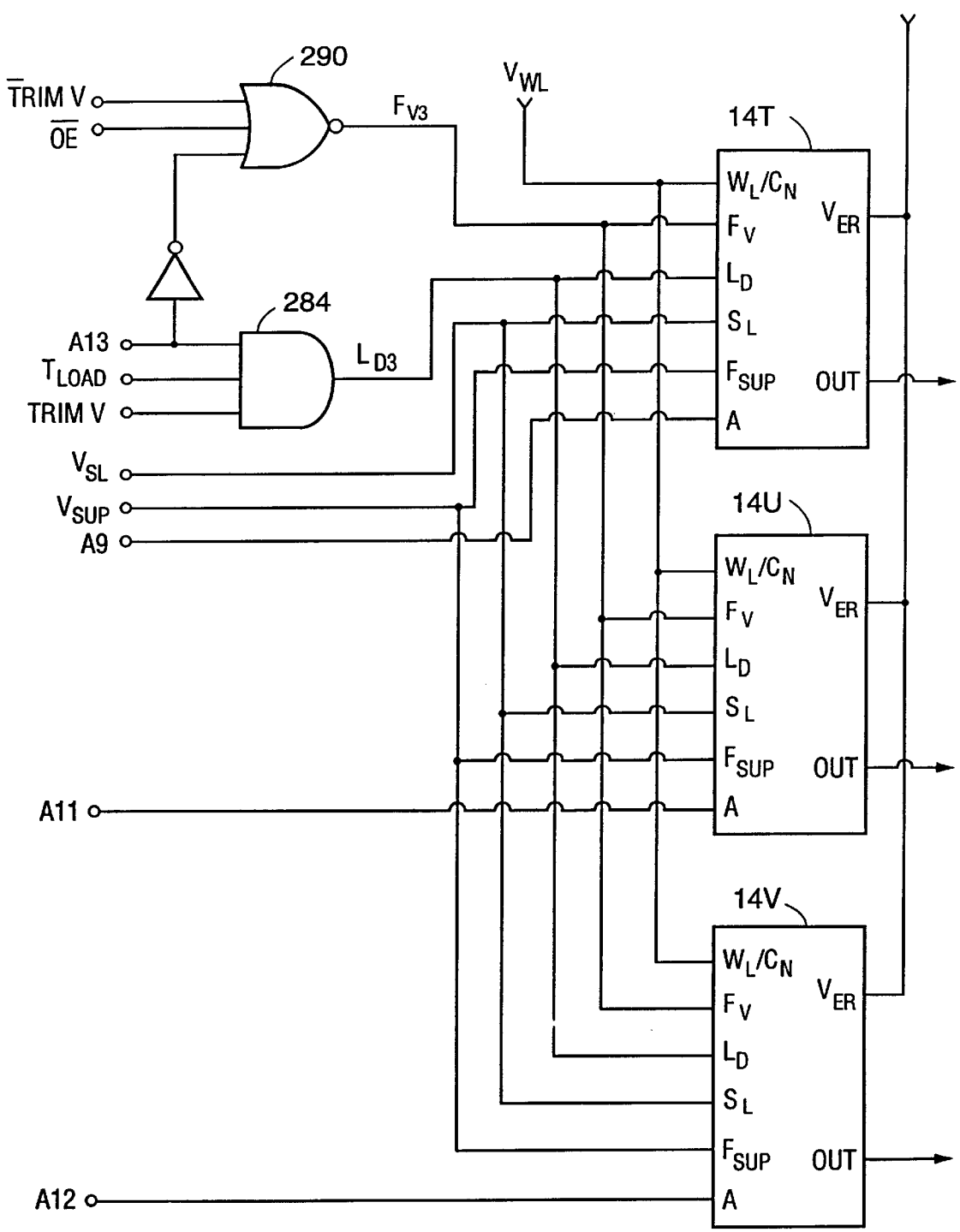

The following exemplary description relates to the operation of the trim function category of control parameters, with such description also being pertinent to the operation of the other control parameter functions. FIGS. 15A–15C show a total of nine data storage units 14N–14V used for storing the control parameters which set the magnitude of various voltage pulses used in memory operations. Three of the data storage units relate to the magnitude of the voltage pulses applied to the word lines of the array during program operations. Those are storage units 14N, 14O and 14P shown in FIG. 15A. Another three of the data storage units relate to the magnitude of the voltage pulses applied to the bit lines of the array 12 during program operations. Those are storage units 14Q, 14R and 14s shown in FIG. 15B. Finally, three of the storage units 14T, 14U and 14V of FIG. 15C relate to the magnitude of the voltage pulses applied to the source lines of the various array blocks during erase operations. Each of these trim functions thus provides for eight different magnitudes ($2^3$) of voltage pulses, depending upon the three control parameters stored in the associated storage units 14.

Figure 17:
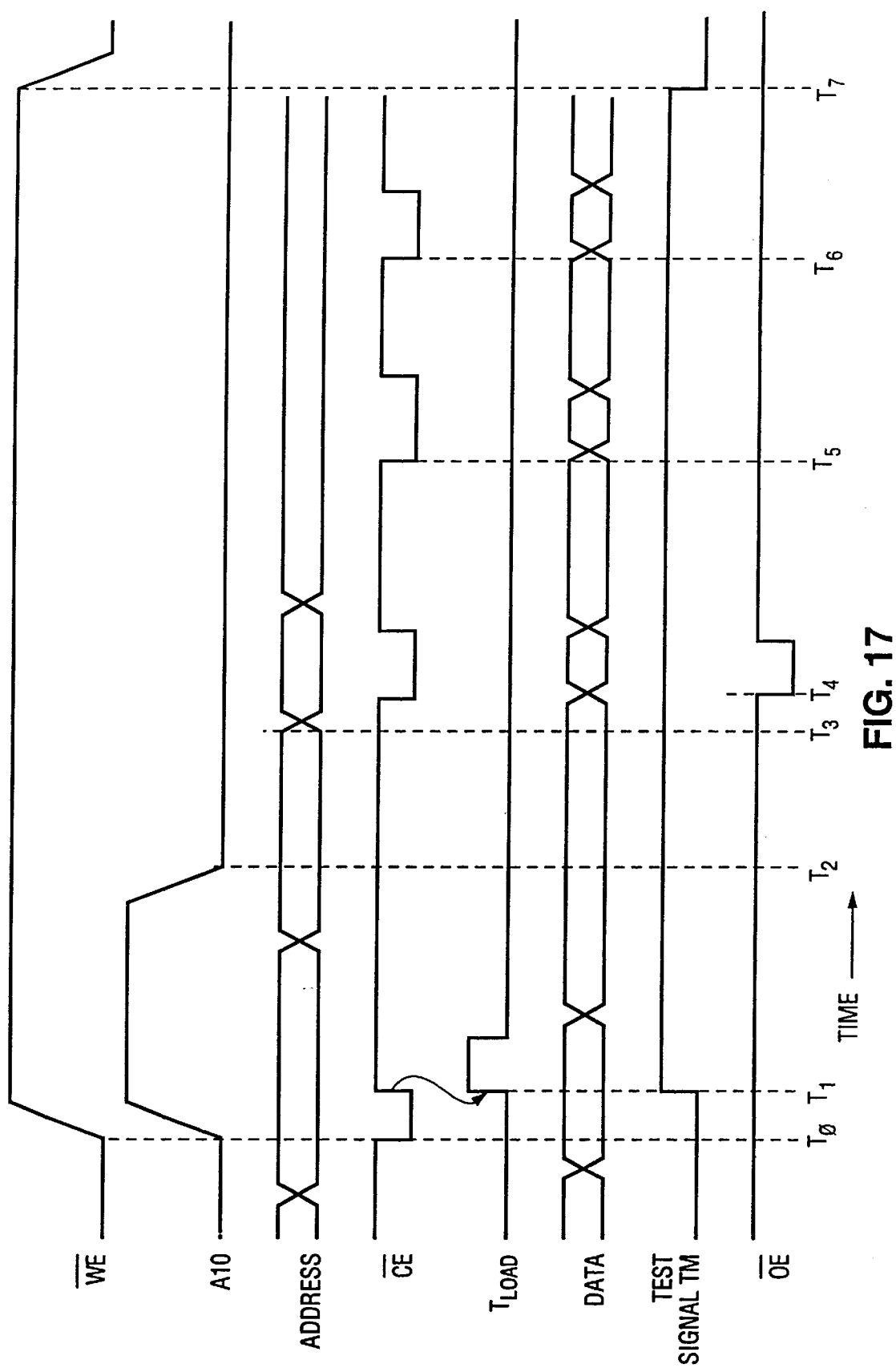
FIG. 17 is a timing diagram further illustrating the manner in which various functions are performed on the data storage units.

Assume that the trim function data storage units are to be manipulated in some manner using the Loading, Erasing, Programming, Recall or Verify cycle. FIG. 17 is a timing diagram showing the principal signals which are generated in carrying some of these cycles. As will be explained, the Recall cycle is automatically initiated at power on and when the memory voltage drops to a low level and does not, therefore, require entry into a test mode. Signal $\overline{RST}$ can be used to trigger the power on circuit for initiating a recall cycle.

The first step is to place the memory system 10 into the appropriate test mode. As previously described in connection with FIG. 14, the voltages on terminal $\overline{WE}$ and address terminal A10 are both brought to +12 volts at initial time $T_0$, as can be seen in the FIG. 17 timing diagram. In addition, the data I/O terminals are provided with data which corresponds to the desired test mode. This is the test mode data which will be entered into the test mode code latch 260 of FIG. 14. The test mode data applied to the data I/O terminals will indicate (1) the memory is to be placed into a test mode and (2) the test mode is one relating to the data storage units and (3) the data storage units are the trim units, as opposed to the other two categories of storage units discussed above.

The test mode code does not specify which of the three categories of trim data storage units is to be operated on. This is done using the address terminals of the memory system at the time the test mode is entered. At this time, address A10 is dedicated to causing the memory system to enter the test mode and it is not, therefore, available. Address terminals A15 and A16 are used to specify which of the three categories of trim data storage units is to be operated on. As can be seen for Table 3 below, the A15 and A16 are set to "1" and "0", respectively, the High Voltage Trim test mode is specified.

TABLE 3

| A15 | A16 | TRIM TEST MODE |
|-----|-----|----------------|
| 0 | 0 | (not used) |
| 0 | 1 | Sense Amp Reference Trim |
| 1 | 0 | High voltage Trim |
| 1 | 1 | Pulse Width Trim |

The address terminals are also used to specify groups of data storage units within the each of the three categories of trim control parameters. The address terminals are assigned the functions set forth below in Table 4 for the nine data storage units used in the High Voltage Trim category.

TABLE 4

| Address Terminals | High Voltage Trim Function |
|-------------------|---------------------------|
| A1 | Program Word Line 1 (storage unit 14N) |
| A2 | Program Word Line 2 (storage unit 14O) |
| A3 | Program Word Line 3 (storage unit 14P) |
| A4 | Program Word Line Enable |
| A5 | Program Bit Line 1 (storage unit 14Q) |
| A6 | Program Bit Line 2 (storage unit 14R) |
| A7 | Program Bit Line 3 (storage unit 14S) |
| A8 | Program Bit Line Enable |
| A9 | Erase Source Line 1 (storage unit 14T) |
| A11 | Erase Source Line 2 (storage unit 14U) |
| A12 | Erase Source Line 3 (storage unit 14V) |
| A13 | Erase Source Line Enable |

As can be seen from Table 4 above, there is an address terminal associated with each of the nine data storage units for the High Voltage Trim function. For example, the three data storage units 14N, 14O and 14P associated with the high voltage applied to the word line in programming has an associated address A1, A2 and A3. In addition, there is an enable address terminal associated with each of the three groups of High Voltage Trim function. For example, address terminal A4 performs an enable function, to be described, for the three word line programming data storage units 14N, 14O and 14P.

Continuing with the example, suppose certain data is to be loaded into the volatile latch section 202 of the data storage units 14N, 14O and 14P, the three units relating to the word line programming voltage. As previously explained, such a load cycle is performed as an initial step for programming a data storage unit. At or prior to time $T_0$ (FIG. 17), the user will set the address terminals A1, A2 and A3 with the data to be stored in the storage units. In addition, the associated enable address A4 will be set to a "1". Since the remaining six data storage units 14Q, 14R, 14S, 14T, 14U and 14V will not be changed, the associated enable address terminals A8 and A13 will be set to "0". In that case, the status of address terminals A5, A6, A7, A9, A11 and A12 can be at any state since they are "don't care."

Also, at time $T_0$, signal $\overline{CE}$ is momentarily brought low and returned to the inactive or high state at time $T_1$. This will cause the test mode data to be transferred to the test mode code latch 260 (FIG. 14). The state machine 19 is implemented to produce a signal $T_{LOAD}$ at this time in response to the rising edge of $\overline{CE}$ provided that the voltages applied to terminals $\overline{WE}$ and A10 are at a high voltage, which is the case. In addition, the test mode format check and decode logic 262 will produce a decode output test signal TM indicating that one of the three test modes associated with the data storage units has been entered. Addresses A15 and A16 will indicate which of the three modes has been selected as indicated by Table 3.

Referring to FIG. 15A which includes the data storage unit 14N to be loaded, addresses A15 and $\overline{A16}$ are coupled to two inputs of a NAND gate 276. The remaining input is test signal TM which went high at time $T_0$. Thus, the output of gate 276 will go active or low by producing signal $\overline{Trim}$ V which indicates that the High Voltage Trim test mode has been entered so that the data storage units 14 set forth in Table 4 may be manipulated. An inverter 278 is provided for generating signal Trim V which, together with $\overline{Trim}$ V, is used by various elements in the FIG. 15A–15C diagrams.

An AND gate 280 is provided which receives sinal Trim V, the high enable address A4 and the $T_{LOAD}$ signal. Since all these signals are high at time $T_1$, the output of gate 280, load signal $L_{D1}$ will go high. Signal $L_{D1}$ is connected to the load input $L_D$ of the three data storage units 14N, 14O and 14P. The data on addresses A1, A2 and A3 and the complements (not depicted) are connected to the data inputs of data units 14N, 14O and 14P, respectively. As previously explained in connection with FIGS. 12 and 13, this will cause the input data to be loaded into the latch section 202 of each data unit. Since the enable addresses A8 and A13 are both low, the corresponding AND gates 282 (FIG. 15B) and 284 (FIG. 15C) will not produce corresponding load signals $L_{D2}$ and $L_{D3}$.

Continuing with the example, if it is assumed that none of the data storage units were to be loaded with data, all of the enable addresses A4, A8 and A13 would have been set to "0" upon entry to the test mode. Addresses A15 and A16 would be set to "1" and "0", respectively as before so that the test mode will continue to be in connection with the nine High Voltage Trim storage units of FIGS. 15A–15C. At time $T_2$, the voltage applied to address terminal A10 will be brought low so that any following chip enable signal $\overline{CE}$ will not reload latch register 260 of the FIG. 14 circuit.

As a further example, assume that a user wants to verify the contents of the volatile latch section 202 of all nine data storage units 14N, 14O, 14P, 14Q, 14R, 14S, 14T, 14U and 14V. Two approaches will be described. As previously described in connection with the operation of the data storage units 14, each unit 14 (FIG. 12) has an internal comparator 201 for comparing the contents of the latch section 202 with the data A and $\overline{A}$ appearing at the input of the storage unit. If there is a match, signal $V_{ER}$ remains high. If there is no match, signal $V_{ER}$ is pulled low. All of the data storage units verify outputs are wire ORed together so that any "no match" of those storage units being verified will produce a low signal $V_{ER}$ which is presented on one of the data I/O terminals of the memory at the end of a verify cycle.

In a typical verify operation, the status of the storage units 14 is periodically tested by placing a first set of test data on the appropriate address terminals and performing a verify cycle. Since it is not possible to directly identify which particular one of storage units is a "no match", the input data is changed and the verify cycle is repeated. This will continue until one particular set of input data applied to the address terminals results in a match (high $V_{ER}$ signal).

In the first verify approach, a first set of test data is applied to address terminals A1, A2, A3, A5, A6, A7, A9, A11 and A12. This occurs around time $T_3$. That data, which may initially be all "0"s, is applied to the data input A of the nine data storage units 14N–14V of the High Voltage Trim function. In addition, the inputs of the three enable addresses A4, A8 and A13 are made high so that all nine data storage units will be verified at the same time. The chip enable signal $\overline{CE}$ is made to go active as it is for all testing operations so that the various memory system elements are enabled. Note that the active signal $\overline{CE}$ will not change the test mode code data in latch 260 (FIG. 14). In addition, the output enable signal $\overline{OE}$ is made active so that, among other things, the bit corresponding to signal $V_{ER}$ can be read out on one of the data I/O terminals of the memory system. Circuitry for utilizing the data I/O terminals and other memory system terminals for alternative functions, such as providing signal $V_{ER}$, is disclosed in Ser. No. 08/508,924, now issued as U.S. Pat. No. 5,619,461 entitled MEMORY HAVING INTERNAL STATE MONITORING CIRCUIT. The contents of this application are hereby fully incorporated into the present application by reference.

NOR gate 286 (FIG. 15A) receives the signal Trim V, which is low, indicating the High Voltage Trim Function test mode. Gate 286 further receives signal $\overline{OE}$ and address data $\overline{A4}$, both of which are also low so that the output of gate 286, signal $F_{V1}$, will be high. Signals $F_{V2}$ and $F_{V3}$ produced by gates 288 and 290 will also be high since the inverted enable addresses $\overline{A8}$ and $\overline{A13}$ are low, as are signals $\overline{OE}$ and Trim V. Thus, all nine comparator circuits of the data storage units 14N–14V will compare the content of their respective latch sections 202 with the corresponding input data A on the associated address terminals.

If there is a no compare at any of the storage units, signal $V_{ER}$ will be low on one of the data I/O terminals at time $T_4$. In that event, the input data on the address terminals will be changed, typically by incrementing the binary value, and the test will be repeated. Conceivably, it may be necessary to repeat this procedure 512 times ($2^9$).

A second approach is to test the storage units in three steps in order to verify the state of the nine storage units. First, enable address A4 is set to a "1" and enable addresses A8 and A13 are made "0". Next, test data is provided only to address terminals A1, A2 and A3 since storage units 14N, 14O and 14P are the only units being verified. These three bits of input data are changed until are compare is present as indicated by a high signal $V_{ER}$. Once the state of units 14N, 14O and 14P has been determined, the three storage units 14Q, 14R and 14S are tested by setting enable address A8 to a "1" and the other enable addresses A4 and A13 to a "0". This is followed by testing units 14T, 14U and 14V by setting enable address A13 to a "1" and the other enable addresses to a "0". This approach of verifying the storage units in small groups by selectively activating the enable addresses is also particularly useful when less than all of the storage units need to be verified. The second approach allows all of the storage units to be verified in only twenty-four cycles ($2^3 \times 3$ sets of units).

As previously described, the recall cycle functions to transfer the non-volatile data stored in the flash section 200 (FIG. 12) to the volatile latch section 202. Since the flash section data will be lost when power is removed from the memory system, or when power is disturbed, a recall cycle is automatically initiated when these events are detected. As shown in the timing diagram of FIG. 13, a recall cycle is performed by grounding the source line $S_L$ of the data storage unit and applying a connect signal $C_N$ and a word line signal $W_L$. In addition, the power supply $F_{SUP}$ to the latch section 202 is momentarily grounded to enable the latch section to be set to the state of the flash section 200 as $F_{SUP}$ is returned to the normal high value.

Figure 16:
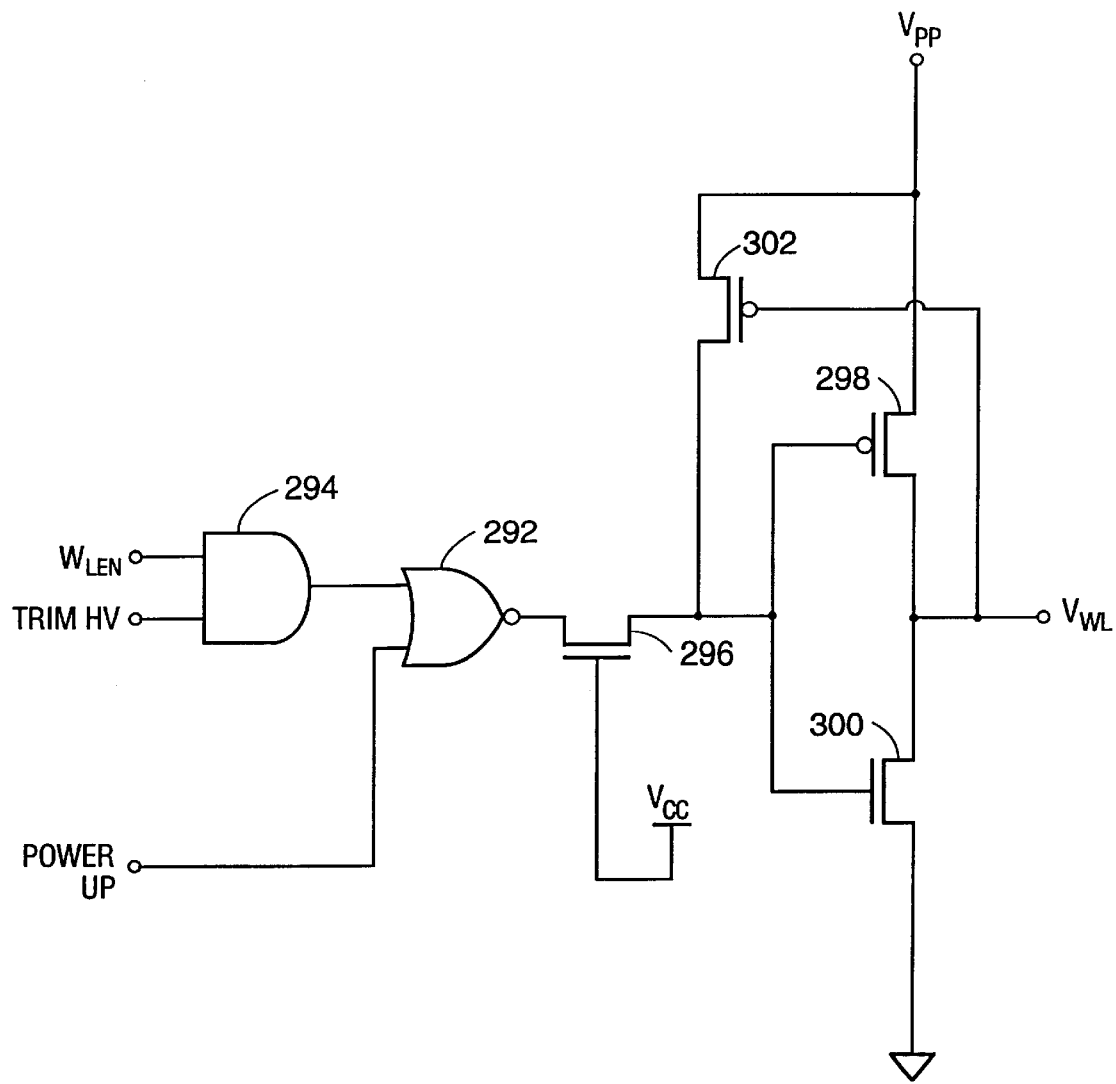
FIG. 16 is a schematic diagram of circuitry used for generating high voltage pulses for programming the data storage units and for other data storage unit operations.

FIG. 16 shows the circuit for generating the signal $V_{WL}$ applied to the combined word line and connect inputs $W_L/C_N$ of each of the data storage units during the recall cycle and during the program cycle. A NOR gate 292 received a Power Up signal at power on and when the power has been disturbed. This causes the gate 292 output to go low thereby pulling the input of an inverter circuit (formed by elements 298 and 300) low by way of an N channel pass transistor 296. Transistor 296, which is always on since the gate is connected to the primary supply voltage $V_{CC}$, is part of a level shifting circuit which converts the output of gate 292 from one which switches between $V_{CC}$ (+5 volts) and ground to one which switches between $V_{CC}$ (+12 volts) and ground. P channel and N channel transistors 298 and 300, respectively, form the inverter, with the circuit output $V_{WL}$ being at the common drain connection of the two transistors. A feedback transistor 302 is included to assist gate 292 in pulling the input to the inverter to a sufficiently high level approaching $V_{PP}$ so that transistor 298 is turned off when the output of gate 292 is high. The word line input $W_L$ and the connect input $C_N$ of all of the data storage units 14 are combined as a single input $W_L/C_N$ since, as previously described, the storage units are capable of operating with these inputs combined. In FIG. 16, the terminal $V_{PP}$ will be at +12 volts only during a programming operation and remain at the $V_{CC}$ level of +5 volts at other times. At power on, the Power Up signal will cause signal $V_{WL}$ applied to the combined input $W_L/C_N$ of the data storage units to go to the $V_{CC}$ level of +5 volts. Circuitry not depicted will also cause signal $V_{SUP}$ applied to inputs $F_{SUP}$ to momentarily go low so that the data in flash C and $\overline{C}$ will be transferred to the latch section 202 thereby causing the recall cycle to be performed.

If the data storage units 14 are to be programmed, it is first necessary to erase the units. Storage unit erasure is carried out by issuing the same type of erase commands used in normal memory operation. However, since the memory system is in a test mode, as opposed to a normal operating mode, the erase commands will result in the erasure of the flash cells C and $\overline{C}$ rather than the flash cells of the memory array 12.

No attempt is made to limit erasure to a limited number of storage units since an erase operation must be followed by a program operation. One reason for this requirement is due to the fact that the erase procedure erases both flash cells C and $\overline{C}$ to the same erased state, whereas storage unit operation requires that the cells store data in complementary form. If a particular storage unit is to be left in its original state, the original data stored in the flash section 200 prior to erasure will be the same data stored in the latch section 202. Thus, after erasure, the subsequent programming sequence will simply reprogram the flash section 200 with the same data which was just erased.

The erase operation is carried out by providing the memory with a pair of erase commands. The commands are provided to the memory by placing the a first erase command (20H) on the data I/O lines at time $T_5$. In addition, signal $\overline{CE}$ is made active (low). This will be followed by a second erase command (D0H) at time $T_6$ which is accompanied by an active signal $\overline{CE}$. These two standard erase commands are forwarded to the Command Execution Logic 16 (FIG. 1) for processing similar to that of normal erase commands. Circuitry in the memory for generating the positive voltage applied to the source lines of the memory array 12 during an erase operation will, instead, produce the same voltage of +12 volts in the form of signal $V_{SL}$. Signal $V_{SL}$ will then be applied to all of the source line inputs $S_L$ of all of the data storage units 14. Since input $W_L/C_N$ are at a low level, the flash cells C and $\overline{C}$ of all of the data storage units will be erased after time $T_6$.

The program cycle is initiated after entry into the trim test modes by issuance of the same pair of commands that are used in normal memory program operations. This cycle causes data stored in the volatile latch section 202 to be transferred to the non-volatile flash section 200. Since the two sections 202 and 200 normally contain the same data, it is necessary to first perform a load cycle to load the latch section 202 with new data to be programmed into the flash section 200. As will be explained, program operations are limited to those data storage units 14 which fall within the selected one of the three trim test modes. Thus, if the nine data storage units used for the High Voltage Trim function are to be programmed, the memory system must be placed in that specific test mode. Data storage units not included in this group of nine will not be programmed in that test mode.

The first command (40H) for programming the flash section 200 of the nine data storage units 14N–14V is a set up command followed by a command which contains the address and data information used in normal memory operations. The second command must be issued even though the address and data applied to the memory data I/O terminals and to the address terminals will be "don't care". In addition to illustrating erase operations at times $T_5$ and $T_6$, the FIG. 17 timing diagram can be used to illustrate program operations at the same time periods. At time $T_5$, when the memory system is in the High Voltage Trim Function test mode, the first program command (40H) is sent using the data I/O terminals. At the same time, the chip enable signal $\overline{CE}$ is made active. This is followed by the second program command which is also accompanied by an active signal $\overline{CE}$. As part of the second command, it is necessary to force the data I/O terminals to some state even though that state is a "don't care." The second command will cause the state machine 19 (FIG. 1) to issue a word line enable signal $W_{LEN}$, which, when in the normal operating mode, will cause the data present in the data I/O terminals to be programmed at the address on the address terminals. However, in the test mode, signal $W_{LEN}$ will instead cause the contents of all of the data storage latch sections 202 to be programmed into the associated flash section 200.

As can be seen in FIG. 16, signal $W_{LEN}$ is applied to one input of an AND gate 294. The second input receives the Trim Hv signal indicating that the memory system is in the High Voltage Trim test mode. The high output of gate 294 will cause gate 292 to be low thereby resulting in the generation of a high (+12 volts) signal $V_{WL}$ as was previously discussed regarding the recall cycle. The high $V_{WL}$ signal is applied to the $W_L/C_N$ inputs of all nine of the data storage units 14N–14V. In addition, the source line inputs $S_L$ are all grounded and the supply inputs $F_{SUP}$ are all at a high level. As can be seen by the timing diagram of FIG. 13, these conditions will result in the flash sections 200 being programmed with the associated latch section 202 data.

Once the test operations have all been concluded, the high voltage applied to terminal $\overline{WE}$ is removed at time $T_7$ thereby causing the memory system to exit the test mode as indicated by the falling edge of test signal TM.

It can be seen that the capability provided by the enable function using, for example, address terminals A4, A8 and A13 (Table 4) provides increased flexibility. Although there are a total of nine data storage units selected, it is possible to control the trim function for only three storage units at a time. Thus, it is possible to verify the state of all nine storage units 14N–14V in only 24 cycles as opposed to 512 cycles. In addition, it is possible to load new control parameter data into only only one of the three sets of the storage units rather than all three sets. For example, if only one set of units such as units 14N–14P are to be modified, the contents of units 14Q–14V do not need to be disturbed. Thus, it is not necessary to determine the status of units 14Q–14V so that they will be reloaded with their previous data in order to load cells 14N–14P with new data.

Thus, a novel memory system having control parameters which may be adjusted after fabrication for optimum performance has been described. Although one embodiment of the system has been described in some detail, it is to be understood that certain changes can be made by those skilled in the art without departing from the spirit and scope of the invention as defined by the appended claims.

What is claimed is:

1. A flash memory comprising:

an array of memory cells;

a memory controller configured to control memory operations, the memory operations comprising memory program operations and memory read operations;

a plurality of data storage units comprising at least one non-volatile cell to store control parameter data used by the memory controller to control the memory operations, and a volatile latch to store the control parameter data when transferred from the at least one non-volatile cell;

switching mode circuitry configured to switch the flash memory between a normal operating mode and an alternative operating mode wherein the control parameter data in the data storage units can be either modified or accessed; and wherein the control parameter data controls a function of the memory controller selected from a list consisting essentially of 1) controlling length of a communication data stream between the flash memory and a processor and 2) selecting between top or bottom addressing formats.

2. The flash memory of claim 1 wherein the memory controller comprises circuitry configured to apply voltage pulses to the array of memory cells, with the voltage pulses having a duration and magnitude and wherein the duration of the voltage pulses can be altered based upon duration control parameter data stored in the data storage units.

3. The flash memory of claim 2 wherein the magnitude of the voltage pulses can be altered based upon magnitude control parameter data stored in the data storage units.

4. The flash memory of claim 2 wherein the memory controller comprises circuitry configured to apply voltage pulses to the array of memory cells, with the voltage pulses having a duration and magnitude and wherein the magnitude of the voltage pulses can be altered based upon magnitude control parameter data stored in the data storage units.

5. The flash memory of claim 4 wherein the duration of the voltage pulses can be altered based upon duration control parameters stored in the data storage units.

6. The memory system of claim 4 wherein the memory operations comprise memory erase operations wherein the memory cells are erased and the voltage pulses include erase voltage pulses.

7. A memory comprising:

an array of memory cells;

a memory controller configured to control memory operations, the memory operations comprising memory program operations and memory read operations;

a plurality of data storage units comprising at least one non-volatile cell to store control parameter data used by the memory controller to control the memory operations, and a volatile latch to store the control parameter data when transferred from the at least one non-volatile cell;

means for performing the function of modifying the control parameter data so as to alter the memory operations; and wherein the control parameter data controls a function selected from a list comprising 1) controlling length of a communication data stream between the memory and a processor and 2) selecting between top or bottom addressing formats.

8. The memory of claim 7 wherein the memory outputs a word of data in the read operations inputs a word of data in program operations and wherein the memory controller comprises circuitry configured to apply voltage pulses to the array of memory cells, with the voltage pulses having a duration and a magnitude;

circuitry configured to address the array of memory cells using a memory address, with the memory address corresponding to a portion of the array; and sense amplifiers configured to compare output voltages indicative of current flow through the memory cells with a reference voltage.

9. The memory of claim 8 wherein the memory controller further comprises at least one of the following four types of circuitry:

(1) circuitry configured to vary the number of bits in the word based upon word control parameters stored in the data storage units;

(2) circuitry configured to vary the duration of the voltage pulses based upon duration control parameters stored in the data storage units;

(3) circuitry configured to vary the magnitude of the voltage pulses based upon magnitude control parameters stored in the data storage units; or (4) circuitry configured to vary a magnitude of the reference voltage based upon reference control parameters stored in the data storage units.

10. A memory device comprising:

an array of memory cells arranged in a multiplicity of rows and columns;

a memory controller configured to control reading and programming operations on the array of memory cells, with the reading and programming operations being controlled in response to one or more control parameters;

a data storage structure including at least one non-volatile data storage unit configured to store the one or more control parameters, and a volatile latch coupled to the non-volatile data storage structure to store the one or more control parameters;

switching mode circuitry configured to switch the memory device between a normal operating mode and an alternative operating mode wherein the one or more control parameters stored in the data storage structure can be altered; and wherein the control parameters operate to cause the memory controller to execute one or more functions selected from a list of 1) controlling length of a communication data stream between the memory device and a processor and 2) selecting between top or bottom addressing formats.

11. The memory device of claim 10 wherein the data storage structure comprises one or more data storage units for controlling a voltage potential of a reference voltage coupled to sense amplifier circuitry.

12. The memory device of claim 10 wherein the data storage structure comprises one or more data storage units for controlling a voltage potential of a reference voltage.

13. The memory device of claim 10 wherein the data storage structure comprises one or more data storage units for controlling a duration of voltage pulses used during an erase operation.

14. The memory device of claim 10 wherein the data storage structure comprises one or more data storage units for controlling a duration of voltage pulses used during a heal operation.

15. The memory device of claim 10 wherein the data storage structure comprises one or more data storage units for controlling a duration of voltage pulses used during a program operation.

16. The memory device of claim 10 wherein the data storage structure comprises one or more data storage units for controlling a magnitude of voltage pulses used during an erase operation.

17. The memory device of claim 10 wherein the data storage structure comprises one or more data storage units for controlling a magnitude of voltage pulses used during a heal operation.

18. The memory device of claim 10 wherein the data storage structure comprises one or more data storage units for controlling a magnitude of voltage pulses used during a program operation.

19. A memory device comprising:

an array of memory cells arranged in a multiplicity of rows and columns;

a memory controller configured to control reading and programming operations on the array of memory cells, with the reading and programming operations being controlled in response to one or more control parameters;

a data storage structure including at least one data storage unit configured to store the one or more control parameters;

switching mode circuitry configured to switch the memory device between a normal operating mode and an alternative operating mode wherein the one or more control parameters stored in the data storage structure can be altered; and wherein the data storage structure comprises one or more data storage units for controlling a length of a communication data stream between the memory device and an external device.

20. A memory device comprising:

an array of memory cells arranged in a multiplicity of rows and columns;

a memory controller configured to control reading and programming operations on the array of memory cells, with the reading and programming operations being controlled in response to one or more control parameters;

a data storage structure including at least one data storage unit configured to store the one or more control parameters;

switching mode circuitry configured to switch the memory device between a normal operating mode and an alternative operating mode wherein the one or more control parameters stored in the data storage structure can be altered; and wherein the data storage structure comprises one or more data storage units for selecting between top or bottom addressing formats.

21. A flash memory system comprising:

a processor; and a flash memory coupled to the processor, the flash memory comprises:

a plurality of memory terminals for providing an interface between the flash memory and processor;

an array of flash memory cells arranged in a multiplicity of rows and columns;

a memory controller configured to carry out memory programming, erasing and reading operations in response to a plurality of control parameters;

a plurality of data storage units configured to store the control parameters the plurality of data storage units comprising non-volatile cells to store the control parameters, and a volatile latch coupled to the non-volatile cells to store the control parameters when transferred from the non-volatile cells;

mode control circuitry configured to switch the memory system between a normal operating mode where the memory programming, erasing and reading operations can be carried out and an alternative operating mode where the control parameters can be altered by way of the memory terminals; and wherein the control parameters control a function of the memory controller selected from a list of 1) controlling length of a communication data stream between the flash memory and the processor and 2) selecting between top or bottom addressing formats.

22. A method of controlling operation of a memory device having an array of memory cells, the method comprising:

placing the memory system in an alternative operating mode:

storing a plurality of control parameters in non-volatile cells of data storage units located separate from the array of memory cells;

switching the memory system from the alternative operating mode to a normal operating mode;

transferring the plurality of control parameters to volatile latches coupled to the non-volatile cells; and operating the memory device using the control parameters stored in the volatile latches to control top or bottom addressing or to control a length of a communication data stream between the memory device and an external device.

23. The method of claim 22 wherein operating the memory device comprises applying programming voltage pulses to the array of memory cells having a magnitude controlled by the stored control parameters.

24. The method of claim 23 wherein operating the memory device further comprises controlling a duration of the applied voltage pulses using the stored control parameters.

25. The method of claim 22 wherein operating the memory device comprises applying erase voltage pulses to the array of memory cells having a magnitude controlled by the stored control parameters.

26. The method of claim 25 wherein operating the memory device further comprises controlling a duration of the applied voltage pulses using the stored control parameters.

27. The method of claim 22 wherein operating the memory device comprises applying heal voltage pulses to the array of memory cells having a magnitude controlled by the stored control parameters.

28. The method of claim 27 wherein operating the memory device further comprises controlling a duration of the applied voltage pulses using the stored control parameters.

29. The method of claim 22 wherein the stored control parameters define a reference voltage used during memory device operations.

30. A method of controlling operation of a memory device having an array of memory cells, the method comprising:

placing the memory system in an alternative operating mode:

storing a plurality of control parameters in data storage units separate from the array of memory cells;

switching the memory system from the alternative operating mode to a normal operating mode;

operating the memory device using the stored control parameters; and wherein the stored control parameters control a length of a communication data stream between the memory device and an external device.

31. A method of controlling operation of a memory, the method comprising:

applying control parameter data to terminals of the memory;

storing a plurality of control parameters in non-volatile cells of data storage units indicative of the applied control parameter data;

programming data into the array of memory cells using the stored control parameters;

transferring the plurality of control parameters to volatile latches coupled to the non-volatile cells;

reading data in the array of memory cells using the control parameters stored in the volatile latches;

erasing data in the array using the stored control parameters;

modifying the stored control parameters using the terminals of the memory; and wherein the stored control parameters operate to select between top or bottom addressing formats.

\* \* \* \* \*